(12) United States Patent
Ye et al.

(10) Patent No.: US 11,394,859 B2
(45) Date of Patent: Jul. 19, 2022

(54) IMAGE CAPTURING APPARATUS, LENS BARREL, AND PRINTED CIRCUIT BOARD

(71) Applicant: CANON KABUSHIKI KAISHA, Tokyo (JP)

(72) Inventors: Wenying Ye, Tokyo (JP); Kazunori Masuda, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 15 days.

(21) Appl. No.: 17/159,287

(22) Filed: Jan. 27, 2021

(65) Prior Publication Data
US 2021/0258461 A1    Aug. 19, 2021

(30) Foreign Application Priority Data
Feb. 14, 2020 (JP) .............................. JP2020-023822

(51) Int. Cl.
| | |
|---|---|
| H04N 5/225 | (2006.01) |
| H02K 11/33 | (2016.01) |
| H02K 41/035 | (2006.01) |
| H05K 1/18 | (2006.01) |
| H05K 7/14 | (2006.01) |
| H01F 27/28 | (2006.01) |
| H04N 5/232 | (2006.01) |
| H05K 1/02 | (2006.01) |
| H01F 27/29 | (2006.01) |

(52) U.S. Cl.
CPC ..... *H04N 5/22521* (2018.08); *H01F 27/2823* (2013.01); *H01F 27/29* (2013.01); *H02K 11/33* (2016.01); *H02K 41/0356* (2013.01); *H04N 5/23212* (2013.01); *H05K 1/0216* (2013.01); *H05K 1/181* (2013.01); *H05K 7/1427* (2013.01); *H02K 2203/03* (2013.01); *H04N 5/2252* (2013.01); *H04N 5/2253* (2013.01); *H04N 5/2254* (2013.01); *H05K 2201/1003* (2013.01)

(58) Field of Classification Search
CPC .................................................. H04N 5/22521
USPC ........................................................ 348/294
See application file for complete search history.

(56) References Cited

U.S. PATENT DOCUMENTS

| | | | |
|---|---|---|---|
| 8,783,816 B2 | 7/2014 | Masuda | 347/17 |
| 2012/0007908 A1 | 1/2012 | Masuda | 347/17 |
| 2020/0084877 A1* | 3/2020 | Ye | H04N 5/2252 |

FOREIGN PATENT DOCUMENTS

JP    2013-089887    5/2013

* cited by examiner

*Primary Examiner* — Joel W Fosselman
(74) *Attorney, Agent, or Firm* — Venable LLP

(57) ABSTRACT

An image capturing apparatus includes a printed wiring board and an inductor. The inductor includes a winding wire portion, a pair of wire portions drawn out from the winding wire portion to a first side in a first direction, and a pair of electrodes connected to the pair of wire portions. The printed wiring board includes a pair of pads connected to the pair of electrodes, and a pair of wiring patterns extending from the pair of pads. Each of the pair of wiring patterns extends from a first portion of corresponding one of the pair of pads. The first portion is a portion extending from an end of the corresponding one of the pair of pads on a second side in the first direction to a length that is two thirds of a length of the corresponding one of the pair of pads in the first direction.

16 Claims, 13 Drawing Sheets

FIG.5
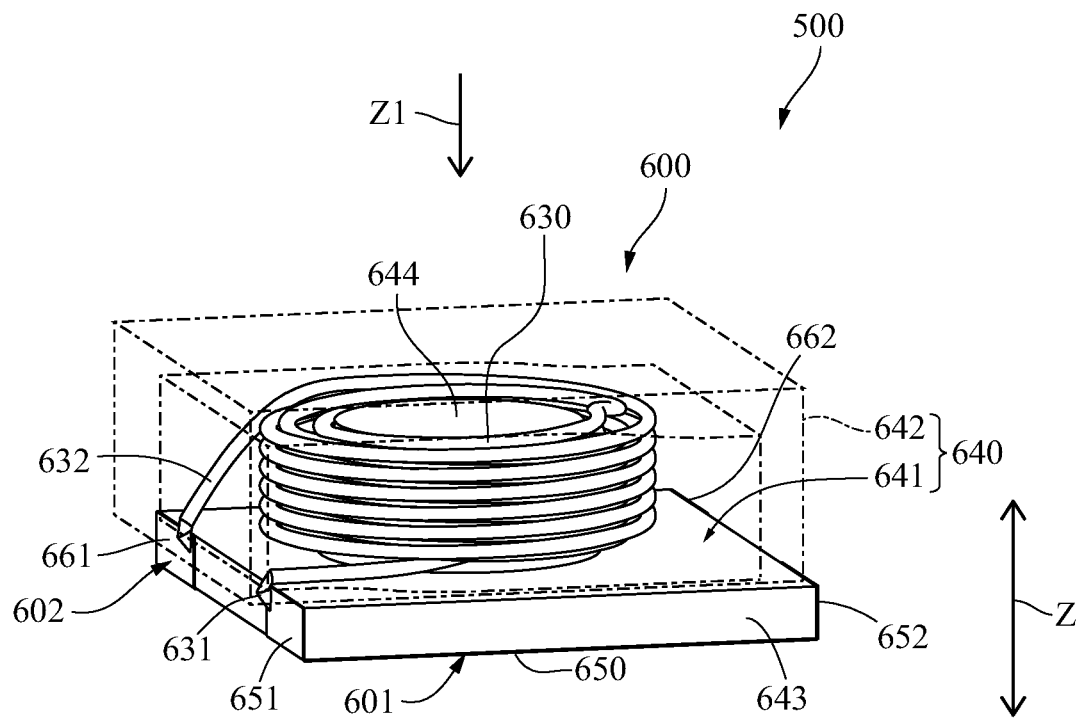
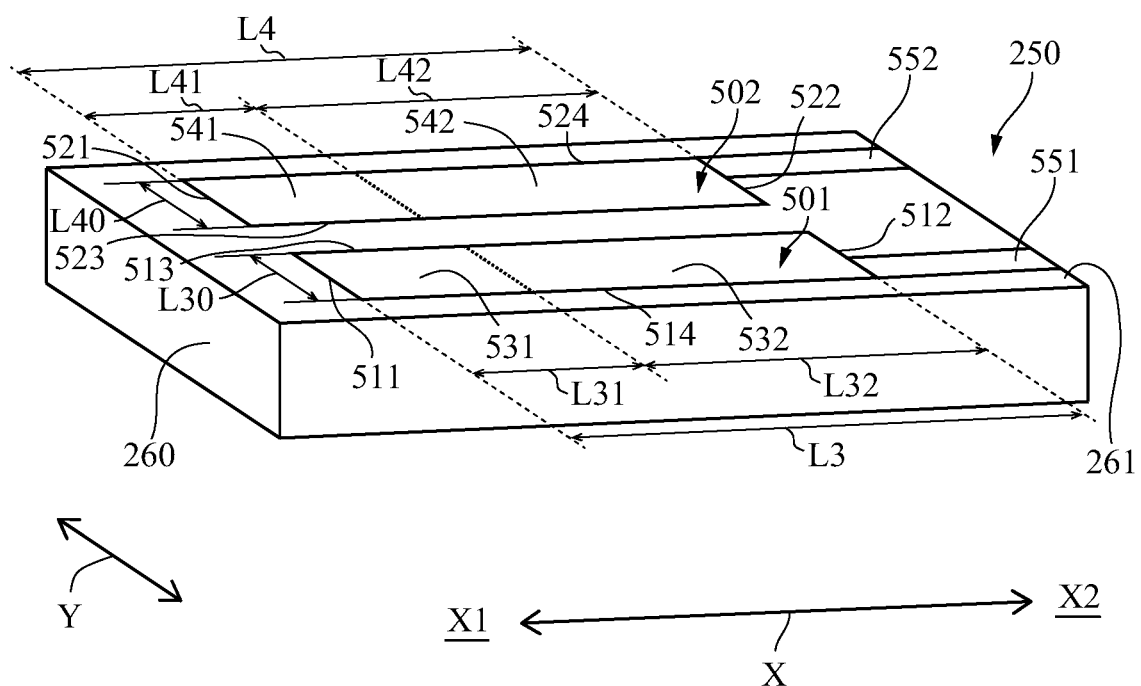

IMAGE CAPTURING APPARATUS, LENS BARREL, AND PRINTED CIRCUIT BOARD

BACKGROUND OF THE INVENTION

Field of the Invention

The present invention relates to a technique for reducing noise radiation.

Description of the Related Art

In an image capturing apparatus such as a digital camcorder or a digital still camera, an inductor is typically provided in a circuit in order to reduce a high-frequency noise that is transmitted from a power source to a load via the circuit. An inductor of this kind includes a winding coil, and there is a problem of a magnetic field noise caused by a leaked magnetic flux. Japanese Patent Laid-Open No. 2013-89887 discloses a technique of reducing the leaked magnetic flux of the inductor.

Meanwhile, in an image capturing device, the ISO sensitivity of the image sensor has been increasing, and a clearer captured image is desired even in the case of capturing an image in a scene with a small amount of light such as a night scenery. However, even in the case of using an inductor as in Japanese Patent Laid-Open No. 2013-89887, it is inevitable that a small magnetic field noise is generated in the inductor. As the ISO sensitivity of the image sensor has increased, it has become more likely for the image sensor to be affected by the magnetic field noise generated in the inductor, and therefore the captured image is disturbed in some cases.

SUMMARY OF THE INVENTION

According to a first aspect of the present invention, an image capturing apparatus includes a casing, an image sensor provided inside the casing, a printed wiring board provided inside the casing, and an inductor mounted on the printed wiring board. The inductor includes a winding wire portion, a pair of wire portions drawn out from the winding wire portion to a first side in a first direction, and a pair of electrodes provided with an interval therebetween in a second direction intersecting to the first direction and connected to the pair of wire portions. The printed wiring board includes a pair of pads connected to the pair of electrodes, and a pair of wiring patterns extending from the pair of pads. Each of the pair of wiring patterns extends from a first portion of corresponding one of the pair of pads. The first portion is a portion extending from an end of the corresponding one of the pair of pads on a second side in the first direction to a length that is two thirds of a length of the corresponding one of the pair of pads in the first direction.

According to a second aspect of the present invention, a lens barrel includes a lens casing, an image capturing optical system provided inside the lens casing and configured to focus light on an image sensor, a printed wiring board provided inside the lens casing, and an inductor mounted on the printed wiring board. The inductor includes a winding wire portion, a pair of wire portions drawn out from the winding wire portion to a first side in a first direction, and a pair of electrodes provided with an interval therebetween in a second direction intersecting to the first direction and connected to the pair of wire portions. The printed wiring board includes a pair of pads connected to the pair of electrodes, and a pair of wiring patterns extending from the pair of pads. Each of the pair of wiring patterns extends from a first portion of corresponding one of the pair of pads. The first portion is a portion extending from an end of the corresponding one of the pair of pads on a second side in the first direction to a length that is two thirds of a length of the corresponding one of the pair of pads in the first direction.

According to a third aspect of the present invention, a printed circuit board includes a printed wiring board, and an inductor mounted on the printed wiring board. The inductor includes a winding wire portion, a pair of wire portions drawn out from the winding wire portion to a first side in a first direction, and a pair of electrodes provided with an interval therebetween in a second direction intersecting to the first direction and connected to the pair of wire portions. The printed wiring board includes a pair of pads connected to the pair of electrodes, and a pair of wiring patterns extending from the pair of pads. Each of the pair of wiring patterns extends from a first portion of corresponding one of the pair of pads. The first portion is a portion extending from an end of the corresponding one of the pair of pads on a second side in the first direction to a length that is two thirds of a length of the corresponding one of the pair of pads in the first direction.

Further features of the present invention will become apparent from the following description of exemplary embodiments with reference to the attached drawings.

BRIEF DESCRIPTION OF THE DRAWINGS

FIG. 5 is a perspective view of part of the driving unit according to the first embodiment.

DESCRIPTION OF THE EMBODIMENTS

Embodiments of the present invention will be described in detail below with reference to drawings.

First Embodiment

Figure 1:
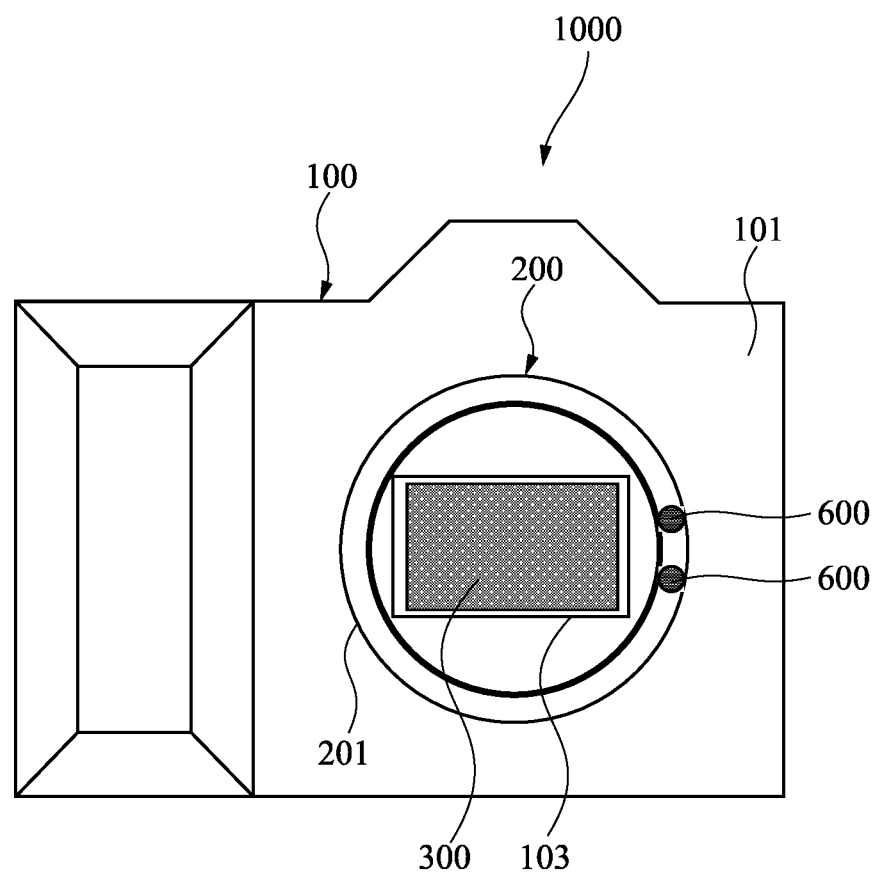
FIG. 1 is an explanatory diagram of a digital camera serving as an example of an image capturing apparatus according to a first embodiment.
Figure 2:
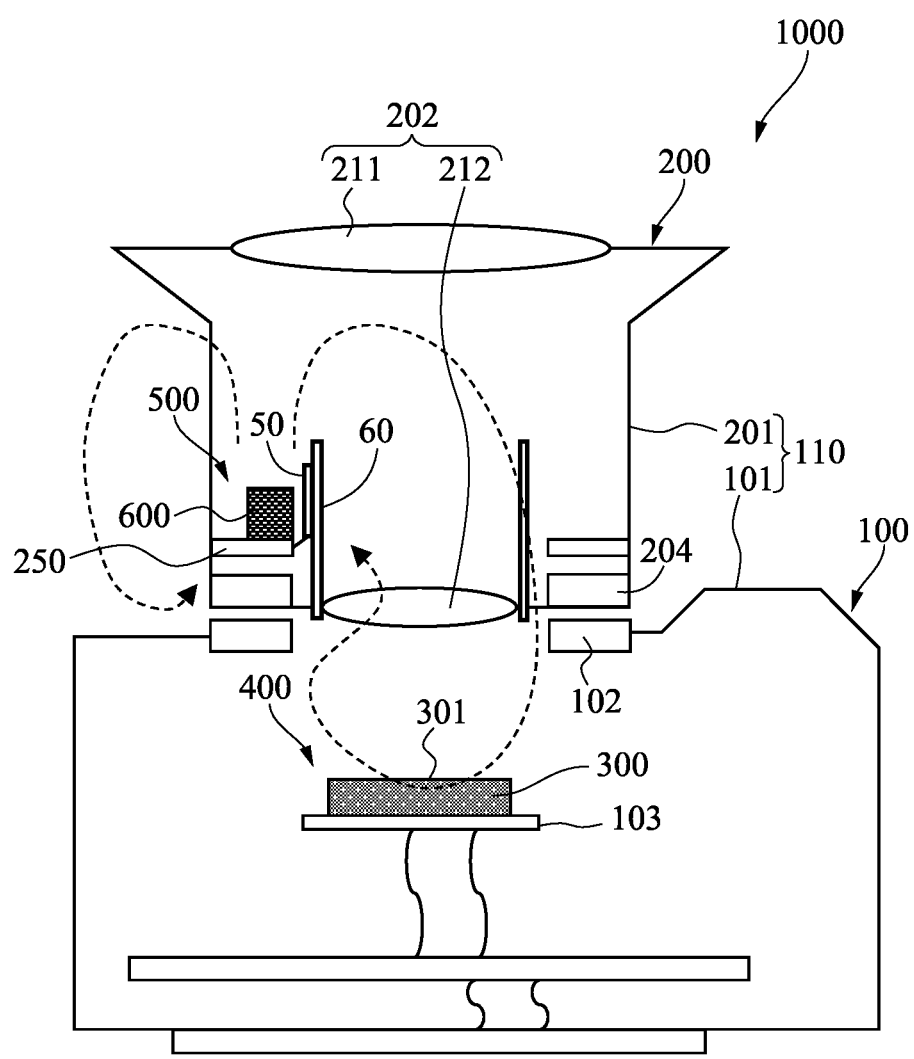
FIG. 2 is another explanatory diagram of the digital camera serving as an example of the image capturing apparatus according to the first embodiment.

FIGS. 1 and 2 are explanatory diagrams of a digital camera serving as an example of an image capturing apparatus according to a first embodiment. FIG. 1 is a schematic front view of a digital camera 1000. FIG. 2 is a schematic top view of the digital camera 1000. For example, the digital camera 1000 is a digital single-lens reflex camera. The digital camera 1000 includes a camera body 100 serving as an image capturing apparatus body, and a lens barrel 200 attachable to and detachable from the camera body 100. The lens barrel 200 is a so-called interchangeable lens.

The camera body 100 includes an exterior case 101 that is a part of a casing 110 of the digital camera 1000. The exterior case 101 includes an attachment portion 102 to which the lens barrel 200 is attached. The attachment portion 102 is formed in a ring shape in front view. An image capturing unit 400 is disposed inside the exterior case 101. The image capturing unit 400 includes an image sensor 300 including a light receiving surface 301, an unillustrated electronic part that controls an image signal, and a printed wiring board 103 on which the image sensor 300 and the unillustrated electronic part are mounted.

The lens barrel 200 includes a lens casing 201 that is a part of the casing 110 of the digital camera 1000. In addition, the lens barrel 200 includes an image capturing optical system 202 that is disposed inside the lens casing 201 and focuses an optical image on the light receiving surface 301 of the image sensor 300 when the lens barrel 200 is attached to the exterior case 101. The lens barrel 200 includes a mount 204 that is formed in a ring shape in front view and attached to the attachment portion 102 of the exterior case 101. In the first embodiment, the casing 110 of the digital camera 1000 is constituted by the exterior case 101 and the lens casing 201.

The image sensor 300 is an image sensor such as a complementary metal-oxide-semiconductor: CMOS image sensor or a charge-coupled device: CCD image sensor. The external shape of the image sensor 300 is a quadrangular shape in front view, that is, as viewed in a direction perpendicular to the light receiving surface 301 of the image sensor 300. The image sensor 300 is disposed inside the exterior case 101 such that the light receiving surface 301 opposes the image capturing optical system 202 in an optical axis direction when the lens barrel 200 is attached to the exterior case 101. The image sensor 300 photoelectrically converts an optical image focused on the light receiving surface 301, and outputs the converted optical image to the printed wiring board 103.

The image capturing optical system 202 includes a plurality of lenses 211 and 212. The lens 211 is disposed on the light incident side of the lens casing 201. The lens 212 is disposed on the light exit side of the lens casing 201. The lens 211 is fixed to the lens casing 201. The lens 212 is supported by the lens casing 201 so as to be slidable in the optical axis direction via a slider 60.

The lens barrel 200 includes an ultrasonic motor: USM 50 serving as an example of a vibration wave motor that is disposed inside the lens casing 201 and drives the lens 212 of the image capturing optical system 202 via the slider 60. The USM 50 also serves as an example of a load. In addition, the lens barrel 200 includes a driving unit 500 serving as an example of a printed circuit board that is disposed inside the lens casing 201 and controls the driving operation of the image capturing optical system 202 performed by the USM 50.

The driving unit 500 includes a printed wiring board 250 and one or more inductors 600 mounted on the printed wiring board 250. In the first embodiment, the driving unit 500 includes two inductors 600. FIG. 2 illustrates only one of the two inductors 600.

The printed wiring board 250 has a shape that does not block an optical path from the image capturing optical system 202 to the light receiving surface 301 of the image sensor 300. For example, the printed wiring board 250 has a ring shape in front view. However, the shape of the printed wiring board 250 is not limited to a ring shape and may be any shape as long as the optical path is not blocked. For example, the printed wiring board 250 may have a shape in which part of a ring is missing, that is, an arcuate shape. The inductors 600 are disposed on the side opposite to the camera body 100 on the printed wiring board 250.

Figure 3:
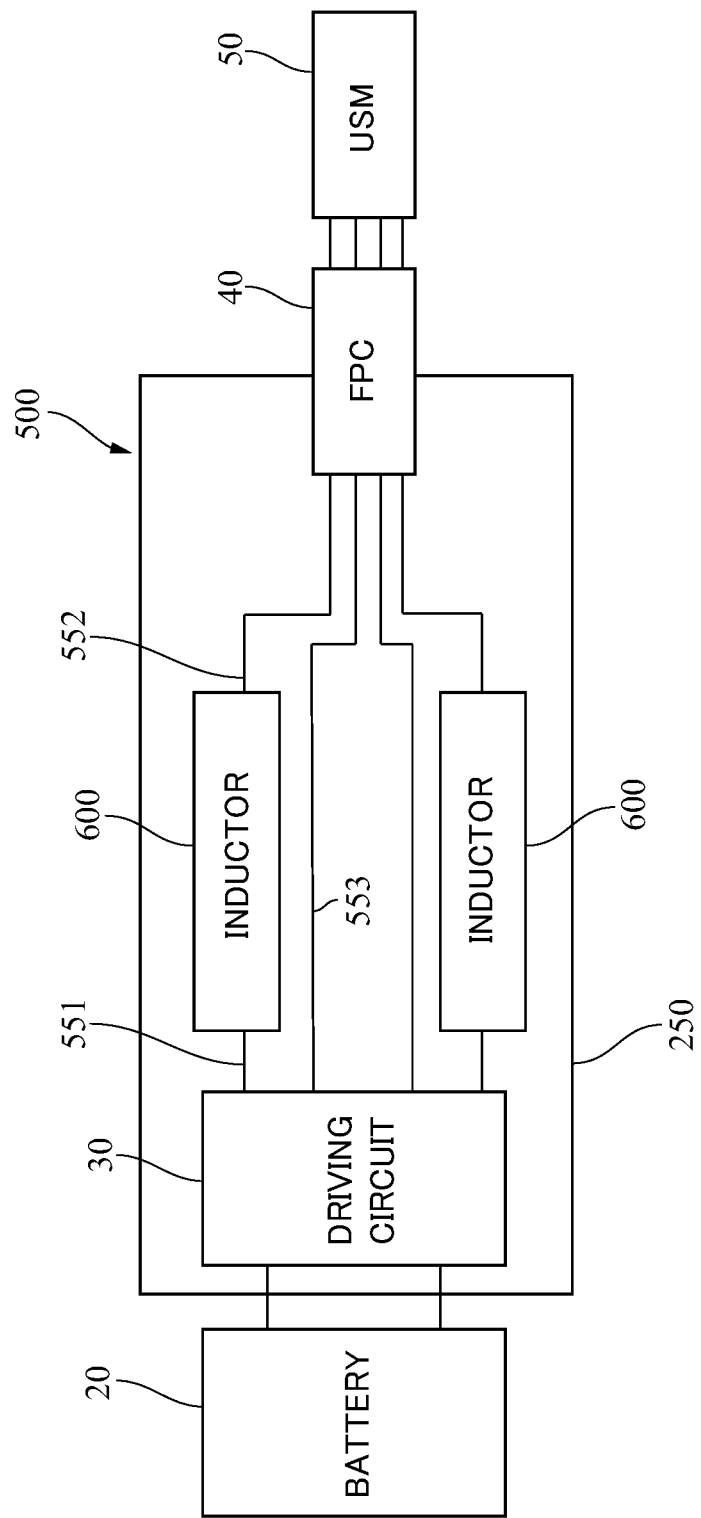
FIG. 3 is a block diagram for describing a circuit configuration of a driving unit serving as an example of a printed circuit board according to the first embodiment.

For the digital camera 1000, an auto focusing system of a contrast detection type in which a signal corresponding to a focus evaluation value of an object is detected, and the object is focused on by driving the image capturing optical system 202 by the driving unit 500 is employed. FIG. 3 is a block diagram for describing a circuit configuration of the driving unit 500 according to the first embodiment.

Here, a battery 20 is disposed inside the exterior case 101 of the camera body 100. The driving unit 500 includes a driving circuit 30 that receives a direct current voltage supplied from the battery 20 and outputs a driving current that is an alternating current for driving the USM 50. For example, the driving current is an alternating current of a driving frequency equal to or higher than 1 kHz and lower than 1 MHz, that is, a driving frequency of a kHz band. The driving circuit 30 is mounted on the printed wiring board 250. The driving current output from the driving circuit 30 is supplied to the USM 50 via a flexible printed circuit board: FPC 40. Since an unnecessary high-frequency current is sometimes superimposed on the driving current output from the driving circuit 30, the inductors 600 are disposed on the output side of the driving circuit 30, for example, between the driving circuit 30 and the FPC 40, to remove the high-frequency current. That is, the driving circuit 30 supplies the driving current that is an alternating current to the USM 50 via the inductors 600. The printed wiring board 250 includes a wiring pattern 551 provided on the driving circuit 30 side with respect to the inductors 600 and a wiring pattern 552 provided on the USM 50 side with respect to the inductors 600. To be noted, the printed wiring board 250 includes a wiring pattern 553 that is a grounding wiring pattern in which a return current flows.

When the driving current flows in one of the inductor 600, a leaked magnetic flux from the inductor 600 is generated, and when this leaked magnetic flux reaches the image sensor 300 illustrated in FIG. 2, this leaked magnetic flux serves as a magnetic field noise in the image sensor 300. To be noted, although the leaked magnetic flux is indicated by broken arrows in FIG. 2, since the leaked magnetic flux is an alternating magnetic field generated by an alternating current, the direction of the leaked magnetic flux is alternately switched between the direction of the broken arrows and a direction opposite thereto.

Figure 4:
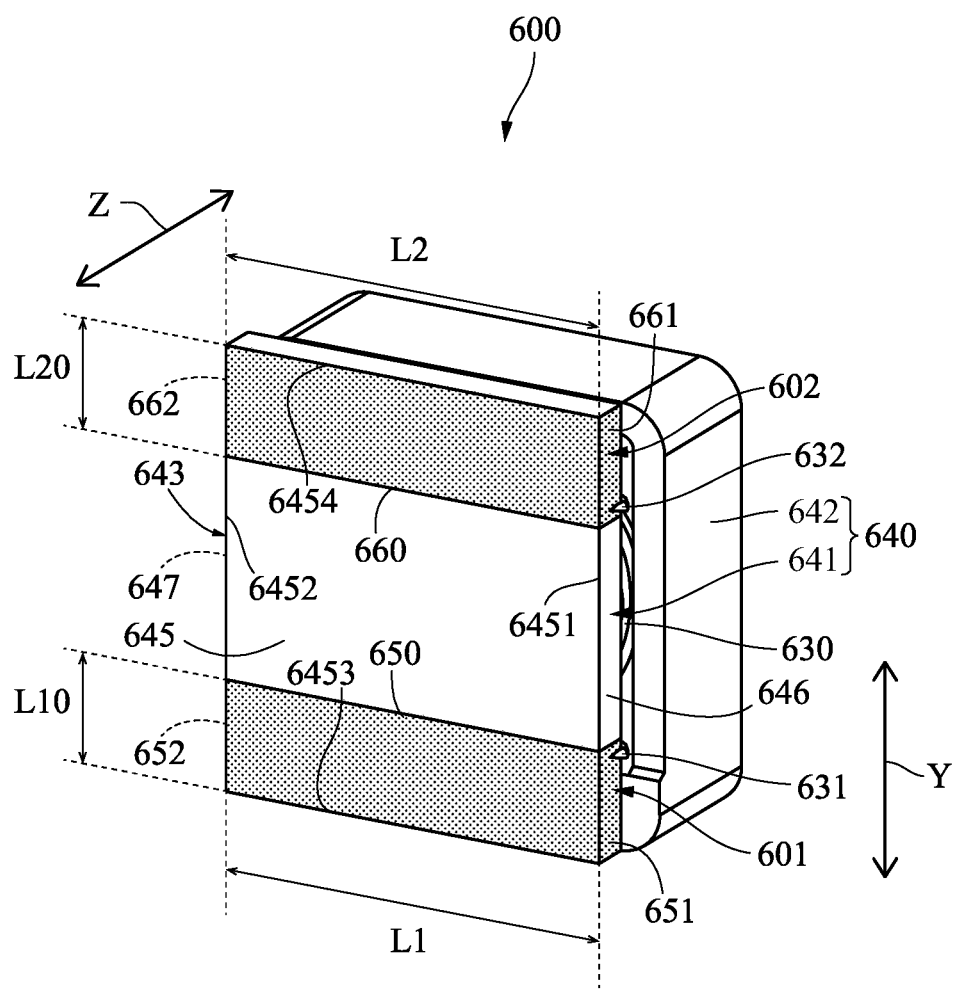
FIG. 4 is a perspective view of an inductor according to the first embodiment.

A configuration of the inductor 600 and the printed wiring board 250 will be described. FIG. 4 is a perspective view of the inductor 600 according to the first embodiment. FIG. 5 is a perspective view of part of the driving unit 500 according to the first embodiment. FIG. 5 illustrates the inductor 600 and the printed wiring board 250 separately for the sake of convenience of description. In addition, FIG. 5 illustrates part of the printed wiring board 250.

The inductor 600 includes a winding wire portion 630, a pair of wire portions 631 and 632 extending from the winding wire portion 630, a pair of electrodes 601 and 602, and a magnetic core 640. The winding wire portion 630 and the pair of wire portions 631 and 632 are formed from a conductive material, for example, copper. The winding wire portion 630 and the pair of wire portions 631 and 632 are formed from a single conductive wire that is continuous. That is, the winding wire portion 630 is continuous with the pair of wire portions 631 and 632. The pair of wire portions 631 and 632 are drawn out toward a first side X1 in an X direction, that is, drawn out to the same direction, from the winding wire portion 630. The pair of wire portions 631 and 632 are connected to the pair of electrodes 601 and 602 via a bonding member such as solder. The wire portion 631 corresponds to the electrode 601, and the wire portion 632 corresponds to the electrode 602. That is, the wire portion 631 is connected to the electrode 601, and the wire portion 632 is connected to the electrode 602. The electrodes 601 and 602 are formed from a conductive material. The winding wire portion 630 is formed by winding a conductive wire. The conductive wire of the winding wire portion 630 is coated with an unillustrated insulator. In addition, parts of the conductive wire of the wire portions 631 and 632 other than parts connected to the electrodes 601 and 602 are coated with an unillustrated insulator.

The pair of electrodes 601 and 602 are arranged in a Y direction perpendicular to the X direction with an interval therebetween. The pair of electrodes 601 and 602 are disposed on the outer surface of the magnetic core 640, and are exposed to the outside of the magnetic core 640. The X direction serves as a first direction, and the Y direction serves as a second direction. In addition, a third direction perpendicular to the X direction and the Y direction will be referred to as a Z direction. The X direction, the Y direction, and the Z direction are not necessarily limited to directions orthogonal to each other, and can be defined as directions intersecting each other.

The magnetic core 640 is formed from a magnetic material, for example, ferrite. The magnetic core 640 is formed in an approximately rectangular parallelepiped shape. In the first embodiment, the magnetic core 640 is constituted by two core portions 641 and 642. The core portion 641 includes a flat plate portion 643 and a columnar portion 644 erecting from the flat plate portion 643. The electrodes 601 and 602 are fixed to the flat plate portion 643. The flat plate portion 643 includes a main surface 645 opposing the printed wiring board 250. The pair of electrodes 601 and 602 are disposed on the main surface 645 side.

The main surface 645 of the magnetic core 640 includes a pair of side edges 6451 and 6452 opposing each other in the X direction, and a pair of side edges 6453 and 6454 opposing each other in the Y direction. The side edge 6451 is positioned on the first side X1 in the X direction. The side edge 6452 is positioned on the second side X2 in the X direction. The electrode 601 is disposed along the side edge 6453 of the main surface 645, and the electrode 602 is disposed along the side edge 6454 of the main surface 645. The electrodes 601 and 602 extend in the X direction to bridge the side edges 6451 and 6452 of the main surface 645.

In the first embodiment, the electrodes 601 and 602 are each formed in a U shape in section view, and are disposed on the main surface 645 and side surfaces 646 and 647 of the flat plate portion 643. Specifically, the electrode 601 includes a main portion 650 in contact with the main surface 645. The main portion 650 is a portion used for connection with the printed wiring board 250. In addition, the electrode 601 includes an end portion 651 on the first side X1 in the X direction, and an end portion 652 on the second side X2 in the X direction. The end portion 651 extends in the Z direction from an end of the main portion 650 on the first side X1 in the X direction, and is in contact with the side surface 646. The end portion 652 extends in the Z direction from an end of the main portion 650 on the second side X2 in the X direction, and is in contact with the side surface 647.

In addition, the electrode 602 has substantially the same configuration as the electrode 601, and includes a main portion 660 in contact with the main surface 645. The main portion 660 is a portion used for connection with the printed wiring board 250. In addition, the electrode 602 includes an end portion 661 on the first side X1 in the X direction, and an end portion 662 on the second side X2 in the X direction. The end portion 661 extends in the Z direction from an end of the main portion 660 on the first side X1 in the X direction, and is in contact with the side surface 646. The end portion 662 extends in the Z direction from an end of the main portion 660 on the second side X2 in the X direction, and is in contact with the side surface 647. In the first embodiment, the wire portion 631 is connected to the end portion 651 of the electrode 601, and the wire portion 632 is connected to the end portion 661 of the electrode 601.

The winding wire portion 630 is wound around the columnar portion 644. A recess portion that accommodates the winding wire portion 630 is defined on the core portion 642. The core portions 641 and 642 are fixed to each other by using an adhesive or the like. Therefore, the winding wire portion 630 is disposed inside the magnetic core 640 so as to be surrounded by the magnetic core 640. As a result of the winding wire portion 630 being surrounded by the magnetic core 640, a magnetic circuit is formed inside the magnetic core 640, most of the magnetic flux generated by the winding wire portion 630 passes through the magnetic circuit inside the magnetic core 640, and part of the magnetic flux generated by the winding wire portion 630 serves as the leaked magnetic flux leaked to the outside of the magnetic core 640.

Therefore, in the first embodiment, the printed wiring board 250 has such a wiring structure as to cancel the leaked magnetic flux of the inductor 600. The printed wiring board 250 includes an insulating substrate 260 including a main surface 261, and a pair of pads 501 and 502 arranged on the main surface 261 with an interval therebetween in the Y direction. To be noted, the X direction and Y direction are parallel to the main surface 261, and the Z direction is perpendicular to the main surface 261. An unillustrated solder resist film is provided on the main surface 261 of the insulating substrate 260. The pads 501 and 502 are each exposed to the outside through an unillustrated opening portion defined in the solder resist film.

The pair of pads 501 and 502 of the printed wiring board 250 are connected to the pair of electrodes 601 and 602 of the inductor 600 via a bonding member such as solder. The pad 501 corresponds to the electrode 601, and the pad 502 corresponds to the electrode 602. That is, the pad 501 is connected to the electrode 601, and the pad 502 is connected to the electrode 602.

The electrodes 601 and 602 are each formed in an approximately quadrangular shape as viewed in the Z direction. In the first embodiment, the electrodes 601 and 602 are each formed in a rectangular shape. Therefore, the electrodes 601 and 602 are each longer in the X direction than in the Y direction. That is, a length L1 of the electrode 601 in the X direction is larger than a length L10 of the electrode 601 in the Y direction. Similarly, a length L2 of the electrode 602 in the X direction is larger than a length L20 of the electrode 602 in the Y direction. Therefore, the X direction serves as a longitudinal direction of the electrodes 601 and 602, and the Y direction serves as a short direction of the electrodes 601 and 602. In the first embodiment, the length L1 of the electrode 601 is equal to the length L2 of the electrode 602. In addition, the length L10 of the electrode 601 is equal to the length L20 of the electrode 602.

The pair of pads 501 and 502 are each formed in an approximately quadrangular shape, specifically a rectangular shape, as viewed in the Z direction. Therefore, the pads 501 and 502 are each longer in the X direction than in the Y direction. That is, a length L3 of the pad 501 in the X direction is larger than a length L30 of the pad 501 in the Y direction. Similarly, a length L4 of the pad 502 in the X direction is larger than a length L40 of the pad 502 in the Y direction. Therefore, the X direction serves as a longitudinal direction of the pads 501 and 502, and the Y direction serves as a short direction of the pads 501 and 502. In the first embodiment, the length L3 of the pad 501 is equal to the length L4 of the pad 502. In addition, the length L30 of the pad 501 is equal to the length L40 of the pad 502.

In the first embodiment, the pad 501 is formed in a size equal to or slightly larger than that of the electrode 601 as viewed in the Z direction. In addition, the pad 502 is formed in a size equal to or slightly larger than that of the electrode 602 as viewed in the Z direction.

The pair of wiring patterns 551 and 552 illustrated in FIG. 3 are disposed on the main surface 261 illustrated in FIG. 5. The pair of wiring patterns 551 and 552 are coated with an unillustrated solder resist film Here, the pad 501 corresponds to the wiring pattern 551, and the pad 502 corresponds to the wiring pattern 552. That is, the wiring pattern 551 extends from the pad 501, and the wiring pattern 552 extends from the pad 502.

The pad 501 includes an end 511 on the first side X1 in the X direction, and an end 512 on the second side X2 in the X direction. In addition, the pad 501 includes an inner side end 513 and an outer side end 514 in the Y direction. The pad 502 includes an end 521 on the first side X1 in the X direction, and an end 522 on the second side X2 in the X direction. In addition, the pad 502 includes an inner side end 523 and an outer side end 524 in the Y direction. The inner side end 513 of the pad 501 and the inner side end 523 of the pad 502 oppose each other in the Y direction with an interval therebetween. The length of the pad 501 from the end 511 to the end 512 in the X direction is the total length of the pad 501 in the X direction, and is referred to as the length L3. The length of the pad 502 from the end 521 to the end 522 in the X direction is the total length of the pad 502 in the X direction, and is referred to as the length L4.

Here, the pad 501 can be divided into a portion 531 including the end 511, and a portion 532 including the end 512. That is, the pad 501 includes the portions 531 and 532. The portion 531 is a portion that opposes the end portion 651 of the electrode 601, and the portion 532 is a portion that opposes the end portion 652 of the electrode 601.

The portion 531 of the pad 501 is a portion extending from the end 511 to a length that is one third of the length L3 of the pad 501 in the X direction. That is, a length L31 of the portion 531 in the X direction is one third of the length L3. The portion 532 of the pad 501 is a portion extending from the end 512 to a length that is two thirds of the length L3 of the pad 501 in the X direction. That is, a length L32 of the portion 532 in the X direction is two thirds of the length L3.

Similarly, the pad 502 can be divided into a portion 541 including the end 521, and a portion 542 including the end 522. That is, the pad 502 includes the portions 541 and 542. The portion 541 is a portion that opposes the end portion 661 of the electrode 602, and the portion 542 is a portion that opposes the end portion 662 of the electrode 602.

The portion 541 of the pad 502 is a portion extending from the end 521 to a length that is one third of the length L4 of the pad 502 in the X direction. That is, a length L41 of the portion 541 in the X direction is one third of the length L4. The portion 542 of the pad 502 is a portion extending from the end 522 to a length that is two thirds of the length L4 of the pad 502 in the X direction. That is, a length L42 of the portion 542 in the X direction is two thirds of the length L4.

The wiring pattern 551 extends from the portion 532 of the pad 501. In addition, the wiring pattern 552 extends from the portion 542 of the pad 502. In the first embodiment, the wiring pattern 551 extends from the end 512 of the pad 501. In addition, the wiring pattern 552 extends from the end 522 of the pad 502.

Figure 6A:
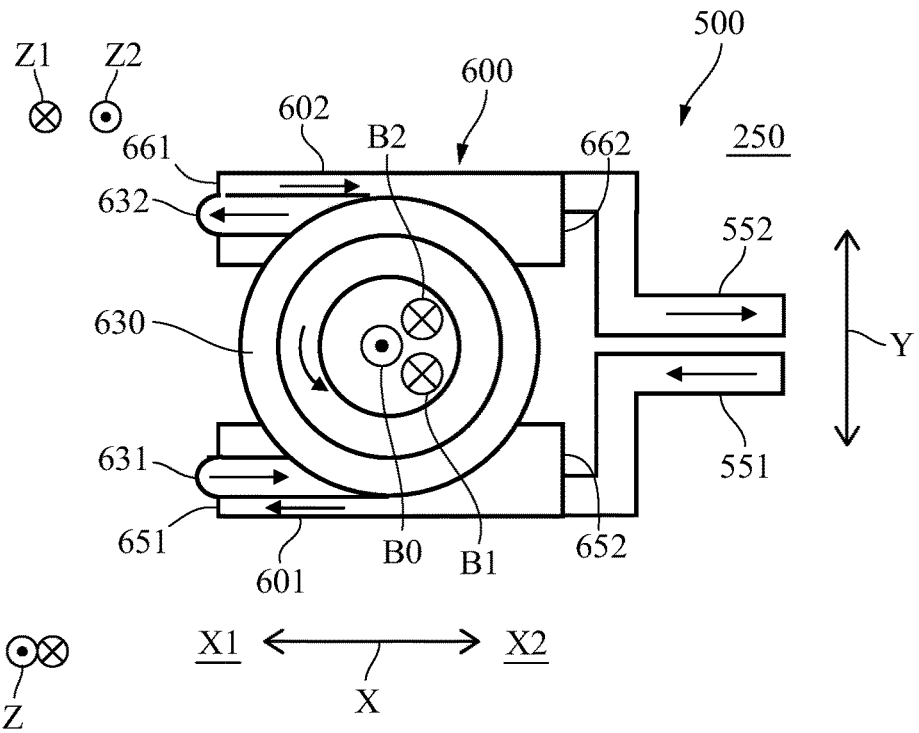
FIG. 6A is a plan view of part of the driving unit according to the first embodiment.
Figure 6B:
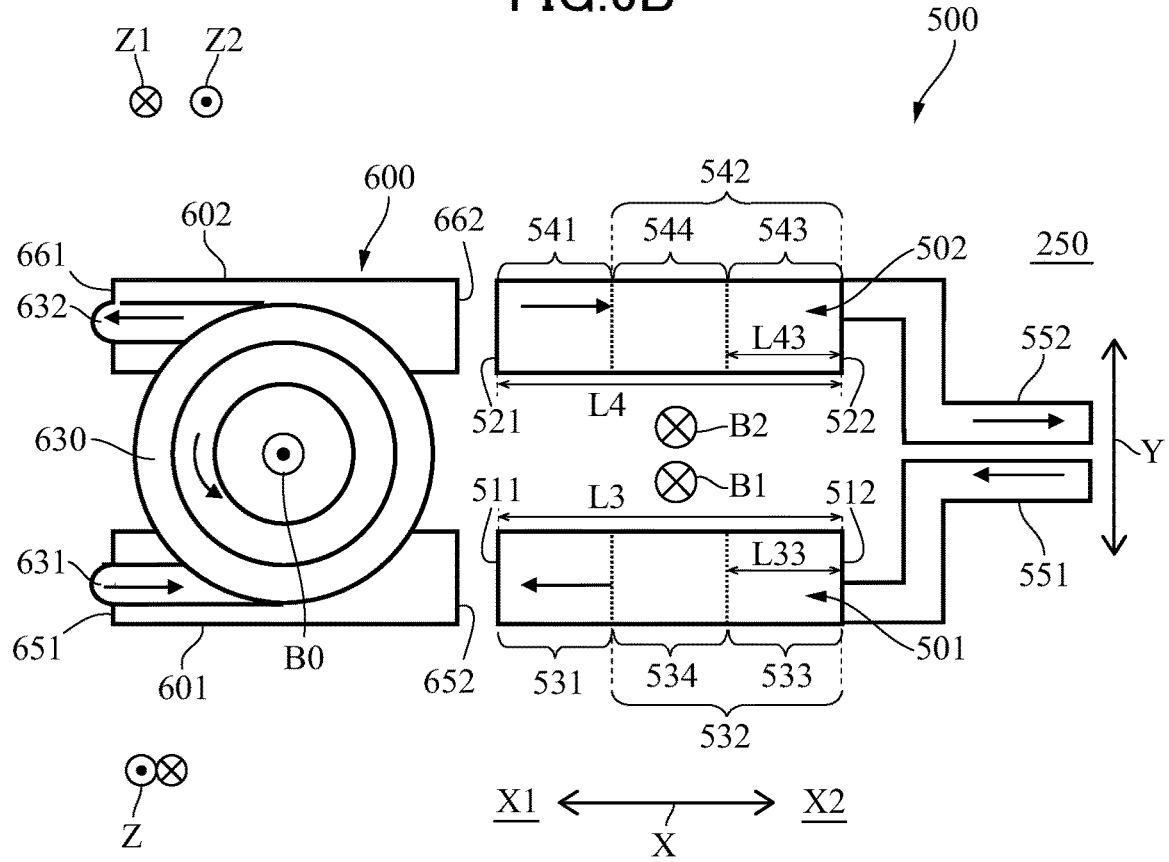
FIG. 6B is a plan view of part of the driving unit according to the first embodiment.

FIGS. 6A and 6B are each a plan view of part of the driving unit 500 according to the first embodiment. FIGS. 6A and 6B illustrate part of the wiring structure of the inductor 600 and part of the wiring structure of the printed wiring board 250 as viewed in an avow Z1 direction of FIG. 5. In FIGS. 6A and 6B, illustration of the magnetic core 640 in the inductor 600 is omitted. In addition, as viewed in the Z direction, the electrode 601 overlaps with the pad 501, and the electrode 602 overlaps with the pad 502. Therefore, since the pads 501 and 502 are covered by the electrodes 601 and 602 as viewed in the avow Z1 direction in FIG. 6A, in FIG. 6B, the inductor 600 is illustrated in a displaced manner with respect to the printed wiring board 250 for the sake of convenience of description. To be noted, the wiring patterns 551 and 552 do not overlap with the inductor 600 as viewed in the Z direction.

The wiring pattern 551 is connected to the portion 532 that makes up two thirds of the pad 501 in the X direction, and the wiring pattern 552 is connected to the portion 542 that makes up two thirds of the pad 502 in the X direction.

When a driving current is flowing in an avow direction illustrated in FIGS. 6A and 6B from the wiring pattern 551, a magnetic flux B0 directed in an avow Z2 direction opposite to the avow Z1 direction is generated inside the winding wire portion 630.

Meanwhile, as a result of the driving current flowing from the portion 532 including the end 512 toward the end 511 in the pad 501, a magnetic flux B1 directed in the avow Z1 direction is generated between the pair of pads 501 and 502. In addition, as a result of the driving current flowing from the end 521 toward the portion 542 including the end 522 in the pad 502, a magnetic flux B2 directed in the arrow Z1 direction is generated between the pair of pads 501 and 502. That is, the magnetic fluxes B1 and B2 are generated in a direction opposite to the magnetic flux B0. To be noted, since the driving current is an alternating current, the directions of the magnetic fluxes B0, B1, and B2 are reversed in the case where the driving current flows in a direction opposite to the direction of the arrow illustrated in FIGS. 6A and 6B, but also in this case, the magnetic fluxes B1 and B2 are generated in a direction opposite to the magnetic flux B0. As a result of this, the magnetic flux B0 is cancelled by the magnetic fluxes B1 and B2, and thus the magnetic field noise radiated from the inductor 600 is reduced.

The pad 501, that is, the portion 532 includes a portion 533 extending from the end 512 of the pad 501 to a length that is one third of the length L3 of the pad 501 in the X direction. That is, a length L33 of the portion 533 in the X direction is one third of the length L3. In the first embodiment, the wiring pattern 551 extends from the portion 533. In the portion 532, a portion 534 other than the portion 533 is positioned between the portion 531 and the portion 533. The lengths of the three portions 531, 534, and 533 of the pad 501 in the X direction are equal.

In addition, the pad 502, that is, the portion 542 includes a portion 543 extending from the end 522 of the pad 502 to a length that is one third of the length L4 of the pad 502 in the X direction. That is, a length L43 of the portion 543 in the X direction is one third of the length L4. In the first embodiment, the wiring pattern 552 extends from the portion 543. In the portion 542, a portion 544 other than the portion 543 is positioned between the portion 541 and the portion 543. The lengths of the three portions 541, 544, and 543 of the pad 502 in the X direction are equal.

In the pad 501, as a result of the driving current flowing from the portion 533 toward the end 511, the generated magnetic flux B1 becomes stronger. In addition, in the pad 502, as a result of the driving current flowing from the end 521 toward the portion 543, the generated magnetic flux B2 becomes stronger. The same applies to the case where the driving current flows in a direction opposite to the arrow direction. As a result of this, the magnetic flux B0 is effectively cancelled by the magnetic fluxes B1 and B2, and thus the magnetic field noise radiated from the inductor 600 is effectively reduced.

Further, in the first embodiment, the wiring pattern 551 is connected to the end 512 on the opposite side to the end 511 in the pad 501, and the wiring pattern 552 is connected to the end 522 on the opposite side to the end 521 of the pad 502. As a result of this, the path of current that generates the magnetic fluxes B1 and B2 at a position overlapping with the inductor 600 becomes longer, and thus the magnetic fluxes B1 and B2 generated at the position overlapping with the inductor 600 can be made even stronger. As a result of this, the effect of cancelling the magnetic flux B0 generated by the winding wire portion 630 is increased, and thus the magnetic field noise radiated from the inductor 600 can be effectively reduced.

Further, in the first embodiment, the wiring pattern 551 is connected to the end 512 of the portion 532 of the pad 501 in the X direction. In addition, the wiring pattern 552 is connected to the end 522 of the portion 542 of the pad 502 in the X direction. As a result of this, the wiring patterns 551 and 552 can be disposed at closer positions on the printed wiring board 250 where the wiring patterns 551 and 552 do not overlap with the inductor 600 as viewed in the Z direction. Therefore, the magnetic field noise radiated from the pair of wiring patterns 551 and 552 can be reduced.

Figure 7A:
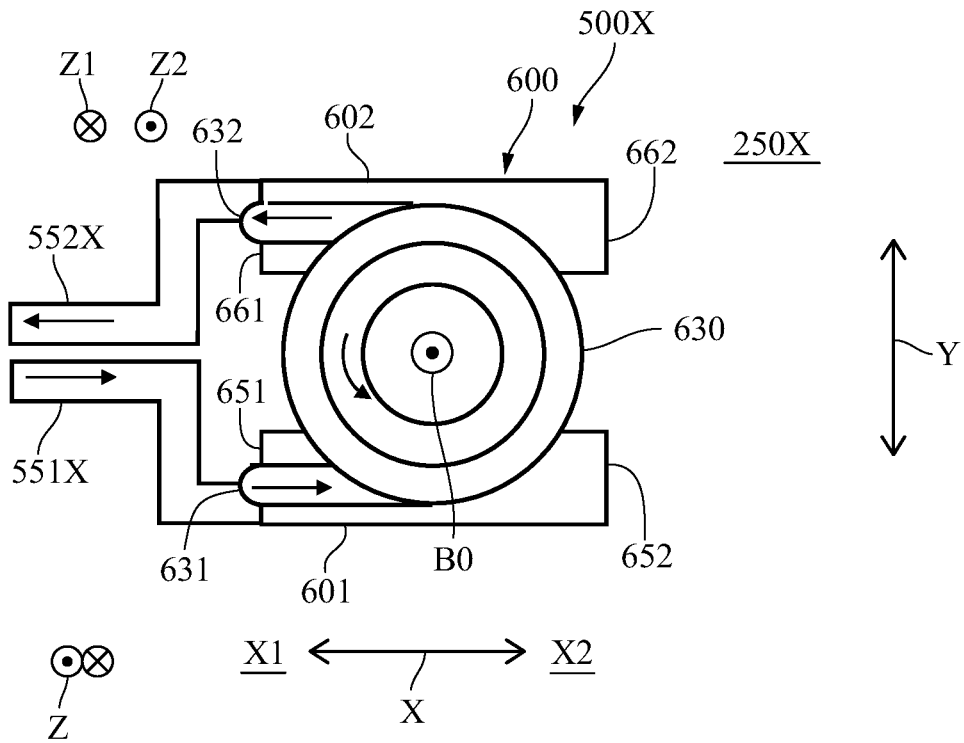
FIG. 7A is a plan view of part of the driving unit according to a comparative embodiment.
Figure 7B:
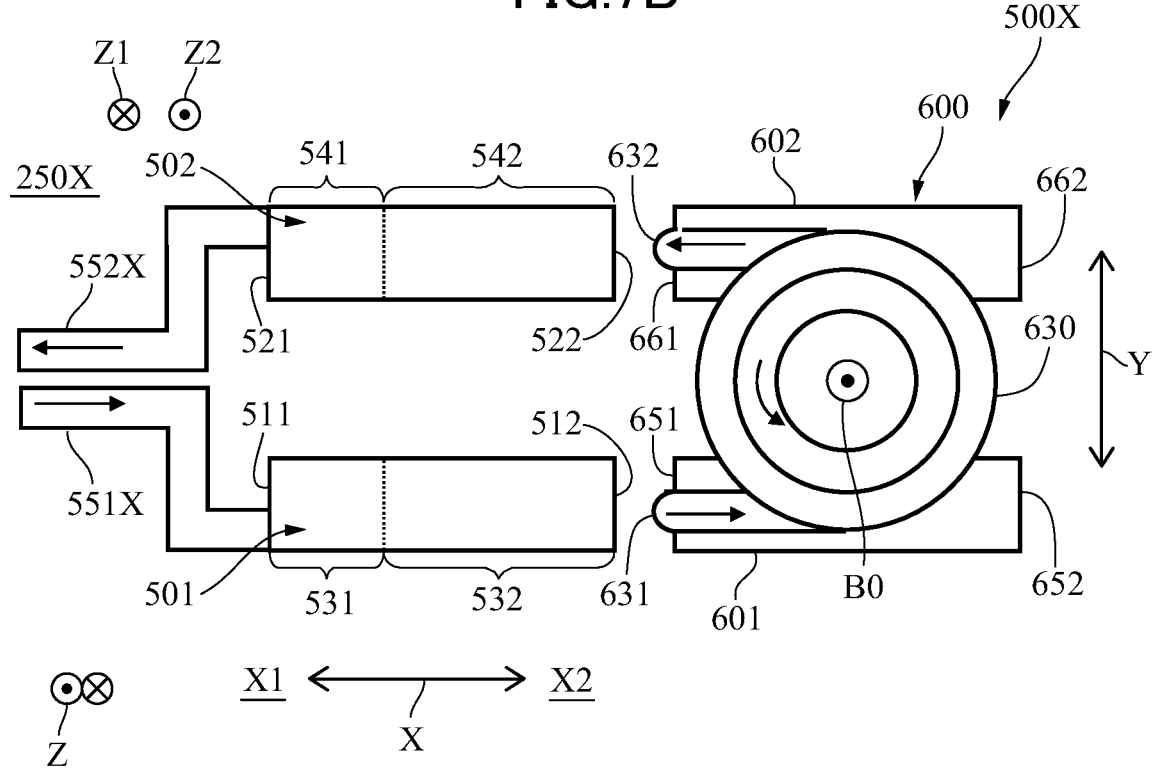
FIG. 7B is a plan view of part of the driving unit according to the comparative embodiment.

Next, a wiring structure of a printed wiring board of a comparative embodiment will be described. FIGS. 7A and 7B are each a plan view of part of the driving unit 500X of the comparative embodiment. The driving unit 500X includes the inductor 600, and a printed wiring board 250X on which the inductor 600 is mounted. FIGS. 7A and 7B illustrate part of the wiring structure of the inductor 600 and part of the wiring structure of the printed wiring board 250X. In the comparative embodiment, the connection position of a wiring pattern 551X to the pad 501 and the connection position of a wiring pattern 552X to the pad 502 are different from the first embodiment.

In the comparative embodiment, the wiring pattern 551X is connected to the end 511 of the pad 501. In addition, the wiring pattern 552X is connected to the end 521 of the pad 502. That is, the wiring patterns 551X and 552X are respectively drawn out from the pads 501 and 502 in the same directions as the directions in which the wire portions 631 and 632 are drawn out. Therefore, in the comparative embodiment, in the case where the driving current is supplied to the inductor 600 through the pair of wiring patterns 551X and 552X, the magnetic fluxes B1 and B2 illustrated in FIGS. 6A and 6B that cancel the magnetic flux B0 cannot be generated at a position overlapping with the inductor 600. In contrast, according to the first embodiment, the magnetic fluxes B1 and B2 that cancel the magnetic flux B0 can be generated, and the magnetic field noise radiated from the inductor 600 can be reduced.

Sine the magnetic field noise radiated from the inductor 600 is reduced by the wiring structure of the printed wiring board 250, the magnetic field noise that reaches the image sensor 300 is reduced. Therefore, the quality of a captured image generated by the image sensor 300 is improved. For example, a clearer image can be obtained even in the case where an image of a scene with a small amount of light such as a night scenery is captured.

Second Embodiment

Figure 8A:
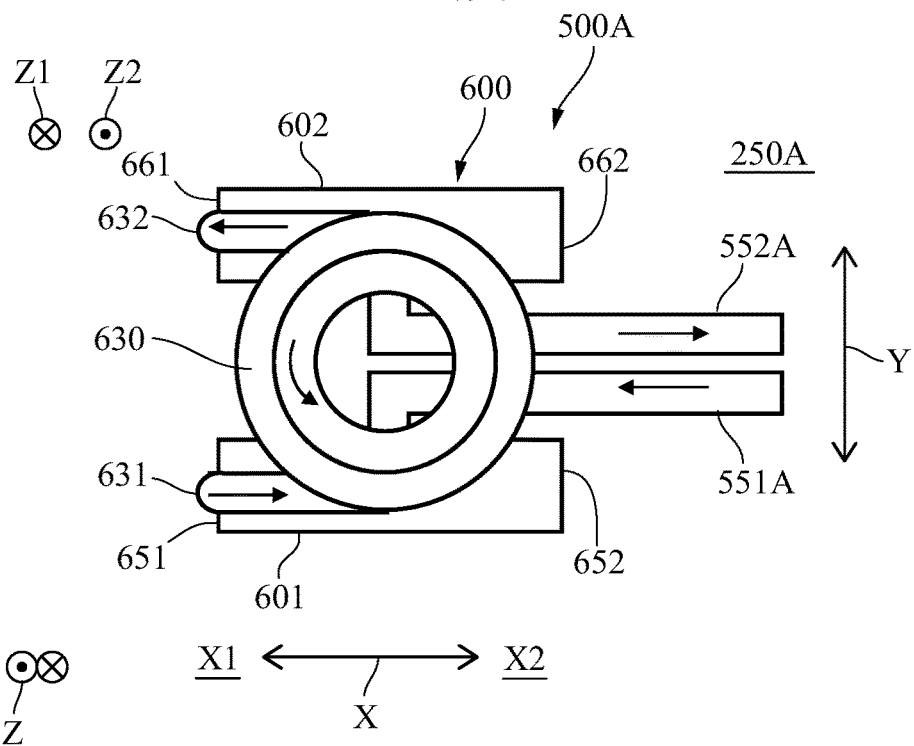
FIG. 8A is a plan view of part of a driving unit serving as an example of a printed circuit board according to a second embodiment.
Figure 8B:
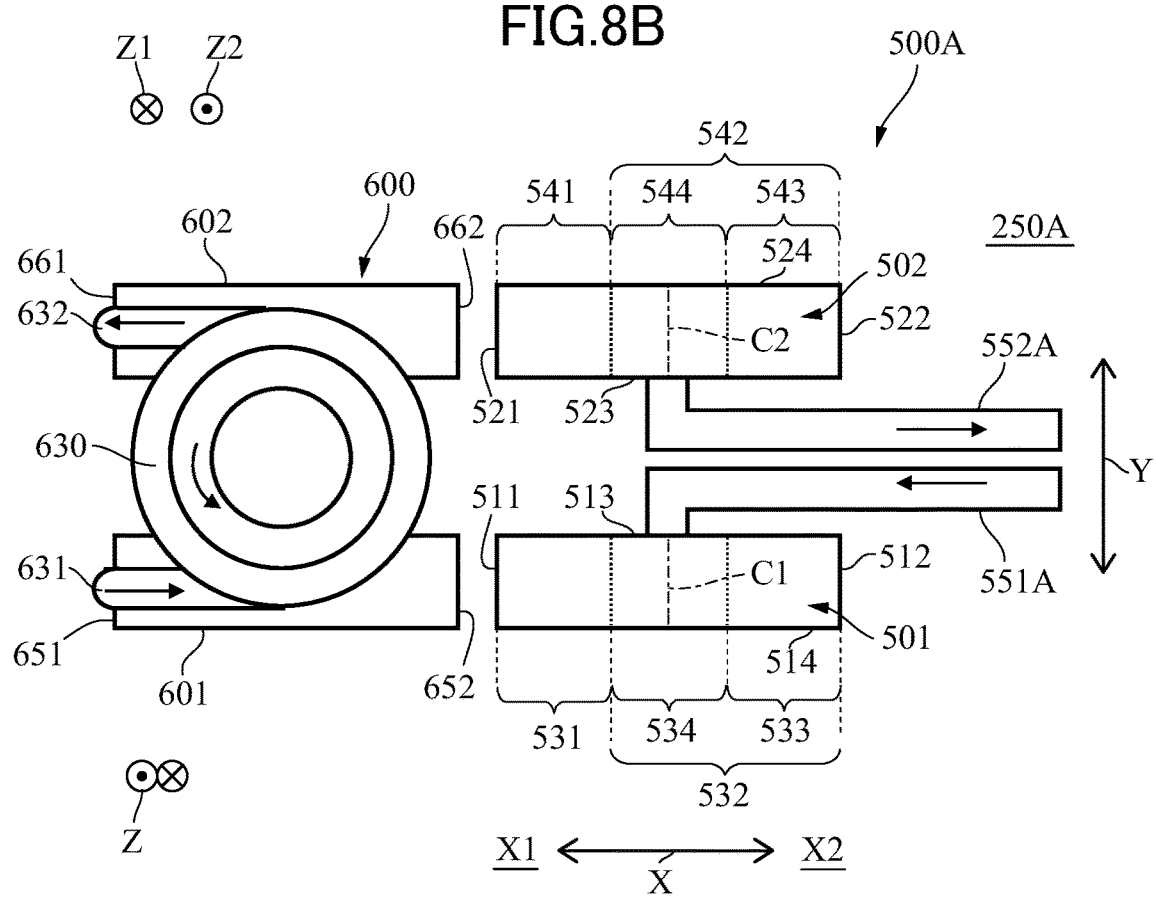
FIG. 8B is a plan view of part of the driving unit serving as an example of the printed circuit board according to the second embodiment.

An image capturing apparatus according to a second embodiment will be described. FIGS. 8A and 8B are each a plan view of part of a driving unit 500A serving as an example of a printed circuit board according to the second embodiment. The driving unit 500A includes the inductor 600, and a printed wiring board 250A on which the inductor 600 is mounted. The printed wiring board 250A includes the pair of pads 501 and 502 and a pair of wiring patterns 551A and 552A. FIGS. 8A and 8B illustrate part of the wiring structure of the inductor 600 and part of the wiring structure of the printed wiring board 250A. In the first embodiment described above, a case where the wiring pattern 551 is connected to the end 512 of the pad 501 and the wiring pattern 552 is connected to the end 522 of the pad 502 as illustrated in FIG. 5 has been described. In the second embodiment, the connection position of the wiring pattern 551A to the pad 501 and the connection position of the wiring pattern 552A to the pad 502 are different from the first embodiment. In the second embodiment, substantially the same elements as in the first embodiment will be denoted by the same reference signs and description thereof will be omitted.

To be noted, in FIGS. 8A and 8B, illustration of the magnetic core 640 in the inductor 600 is omitted. In addition, as viewed in the Z direction, the electrode 601 overlaps with the pad 501, and the electrode 602 overlaps with the pad 502. Therefore, since the pads 501 and 502 are covered by the electrodes 601 and 602 as viewed in the avow Z1 direction in FIG. 8A, in FIG. 8B, the inductor 600 is illustrated in a displaced manner with respect to the printed wiring board 250A for the sake of convenience of description.

The wiring pattern 551A extends from the portion 532 of the pad 501. The wiring pattern 552A extends from the portion 542 of the pad 502. In the second embodiment, the wiring pattern 551A extends from the portion 534 in the portion 532 of the pad 501. In addition, in the second embodiment, the wiring pattern 552A extends from the portion 544 in the portion 542 of the pad 502.

In the second embodiment, the wiring pattern 551A is connected to a center C1 of the pad 501 in the X direction. The center C1 is included in the portion 534. In addition, in the second embodiment, the wiring pattern 552A is connected to a center C2 of the pad 502 in the X direction. The center C2 is included in the portion 544. The wiring pattern 551A may be connected to either one of the inner side end 513 and the outer side end 514, and is connected to the inner side end 513 in the second embodiment. Similarly, the wiring pattern 552A may be connected to either one of the inner side end 523 and the outer side end 524, and is connected to the inner side end 523 in the second embodiment. The magnetic field noise radiated from the inductor 600 can be reduced also with such a wiring structure.

Examples

The magnetic field generated from the inductor 600 by supplying an alternating current to the inductor 600 through the pair of wiring patterns was simulated and actually measured for the first embodiment, the second embodiment, and the comparative embodiment described above. The measurement results and simulation results corresponding to the first embodiment will be described as Example 1, the measurement results and simulation results corresponding to the second embodiment will be described as Example 2, and the measurement results and simulation results corresponding to the comparative embodiment will be described as Comparative Example 1.

The magnetic field was measured by disposing a probe of a spectrum analyzer at a position 1 cm away from the inductor 600 in the arrow Z1 direction. Specifically, the X-direction component, the Y-direction component, and the Z-direction component of the magnetic field were measured. In addition, the magnetic field at the position 1 cm away from the inductor 600 in the arrow Z1 direction was simulated. Specifically, the X-direction component, the Y-direction component, and the Z-direction component of the magnetic field, and the absolute value of the magnetic field were simulated. The average of values obtained in a 1 cm³ cubic space was used as each simulation value.

In both the measurement and the simulation, an alternating current of a frequency of 100 kHz and an amplitude of 100 mA was supplied to the inductor 600. In the measurement, an inductor having an inductance of a nominal value of 10 μH whose allowable range was ±20% was used as the inductor 600. In the simulation, the inductance of the inductor 600 was set to 11.6 μH.

Figure 9A:
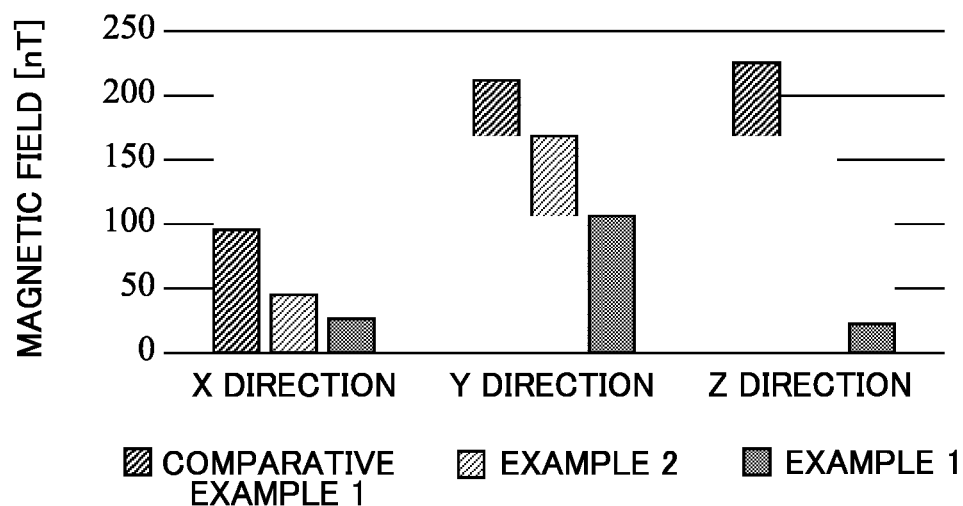
FIG. 9A is a graph showing measurement results of examples.

FIG. 9A is a graph showing the measurement results of the examples. As illustrated in FIG. 9A, the X-direction component, the Y-direction component, and the Z-direction component of the magnetic field were all smaller in Examples 1 and 2 than in Comparative Example 1. That is, it was confirmed that connecting the wiring patterns 551 and 551A to the portion 532 of the pad 501 and connecting the wiring patterns 552 and 552A to the portion 542 of the pad 502 has an effect of reducing the magnetic field noise.

In addition, the X-direction component, the Y-direction component, and the Z-direction component of the magnetic field were all smaller in Example 1 than in Example 2. That is, it was confirmed that connecting the wiring pattern 551 to the end 512 of the pad 501 and connecting the wiring pattern 552 to the end 522 of the pad 502 has a bigger effect of reducing the magnetic field noise.

Figure 9B:
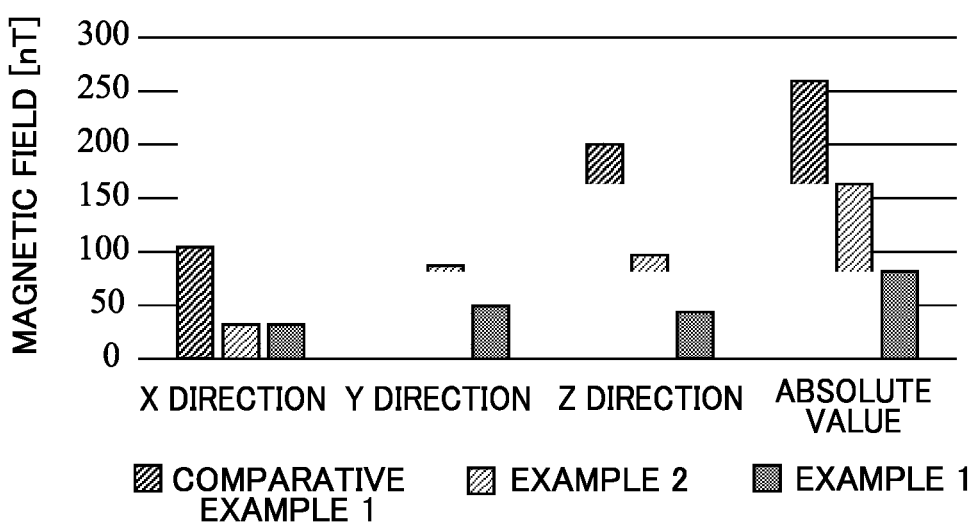
FIG. 9B is a graph showing simulation results of the examples.

FIG. 9B is a graph showing the simulation results of the examples. The simulation results show the same tendency as the measurement results. As illustrated in FIG. 9B, the X-direction component, the Y-direction component, and the Z-direction component of the magnetic field, and the absolute value of the magnetic field were all smaller in Examples 1 and 2 than in Comparative Example 1. That is, it was confirmed that connecting the wiring patterns 551 and 551A to the portion 532 of the pad 501 and connecting the wiring patterns 552 and 552A to the portion 542 of the pad 502 has an effect of reducing the magnetic field noise.

In addition, the X-direction component, the Y-direction component, and the Z-direction component of the magnetic field, and the absolute value of the magnetic field were all smaller in Example 1 than in Example 2. That is, it was confirmed that connecting the wiring pattern 551 to the end 512 of the pad 501 and connecting the wiring pattern 552 of the pad 502 to the end 522 has a bigger effect of reducing the magnetic field noise.

Third Embodiment

Figure 10:
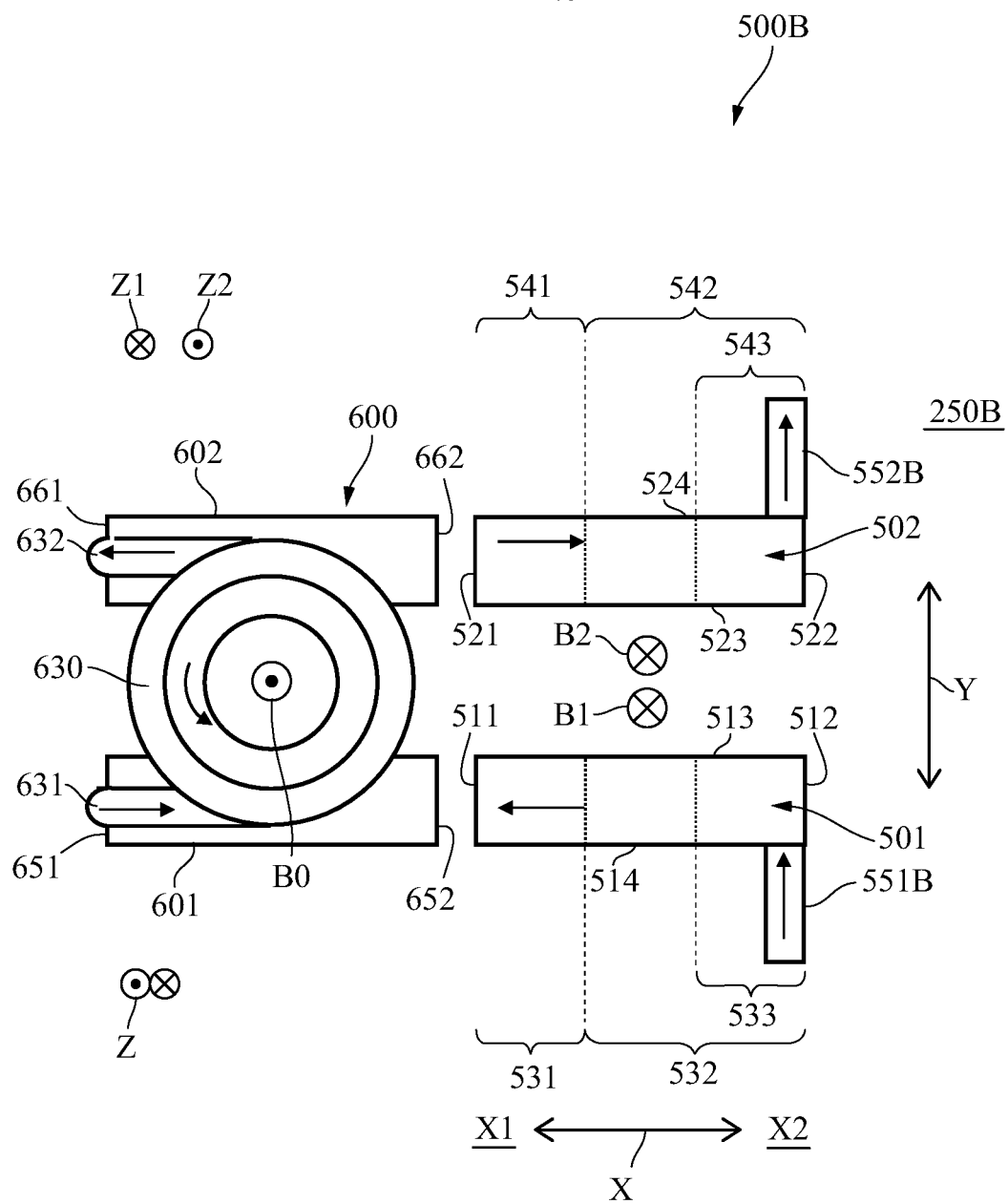
FIG. 10 is a plan view of part of a driving unit serving as an example of a printed circuit board according to a third embodiment.

An image capturing apparatus according to a third embodiment will be described. FIG. 10 is a plan view of part of a driving unit 500B serving as an example of a printed circuit board according to the third embodiment. The driving unit 500B includes the inductor 600, and a printed wiring board 250B on which the inductor 600 is mounted. The printed wiring board 250B includes the pair of pads 501 and 502 and a pair of wiring patterns 551B and 552B. FIG. 10 illustrates part of the wiring structure of the inductor 600 and part of the wiring structure of the printed wiring board 250B. In the first embodiment described above, a case where the wiring pattern 551 is connected to the end 512 of the pad 501 and the wiring pattern 552 is connected to the end 522 of the pad 502 as illustrated in FIG. 5 has been described. In the third embodiment, the connection position of the wiring pattern 551B to the pad 501 and the connection position of the wiring pattern 552B to the pad 502 are different from the first embodiment. In the third embodiment, substantially the same elements as in the first embodiment will be denoted by the same reference signs and description thereof will be omitted.

To be noted, in FIG. 10, illustration of the magnetic core 640 in the inductor 600 is omitted. In addition, as viewed in the Z direction, the electrode 601 overlaps with the pad 501, and the electrode 602 overlaps with the pad 502. Therefore, in FIG. 10, the inductor 600 is illustrated in a displaced manner with respect to the printed wiring board 250B for the sake of convenience of description.

The wiring pattern 551B extends from the portion 532 of the pad 501. In addition, the wiring pattern 552B extends from the portion 542 of the pad 502. The wiring pattern 551B may be connected to either one of the inner side end 513 and the outer side end 514, and is connected to the outer side end 514 in the third embodiment. Similarly, the wiring pattern 552B may be connected to either one of the inner side end 523 and the outer side end 524, and is connected to the outer side end 524 in the third embodiment. In addition, the connection position of the wiring pattern 551B to the side end is preferably close to the end 512 because the magnetic flux B1 is larger when the connection position is closer to the end 512. In the third embodiment, the wiring pattern 551B is connected to the portion 533. Similarly, the connection position of the wiring pattern 552B to the side end is preferably close to the end 522 because the magnetic flux B2 is larger when the connection position is closer to the end 522. In the third embodiment, the wiring pattern 552B is connected to the portion 543. The magnetic field noise radiated from the inductor 600 can be reduced also with such a wiring structure.

Fourth Embodiment

Figure 11:
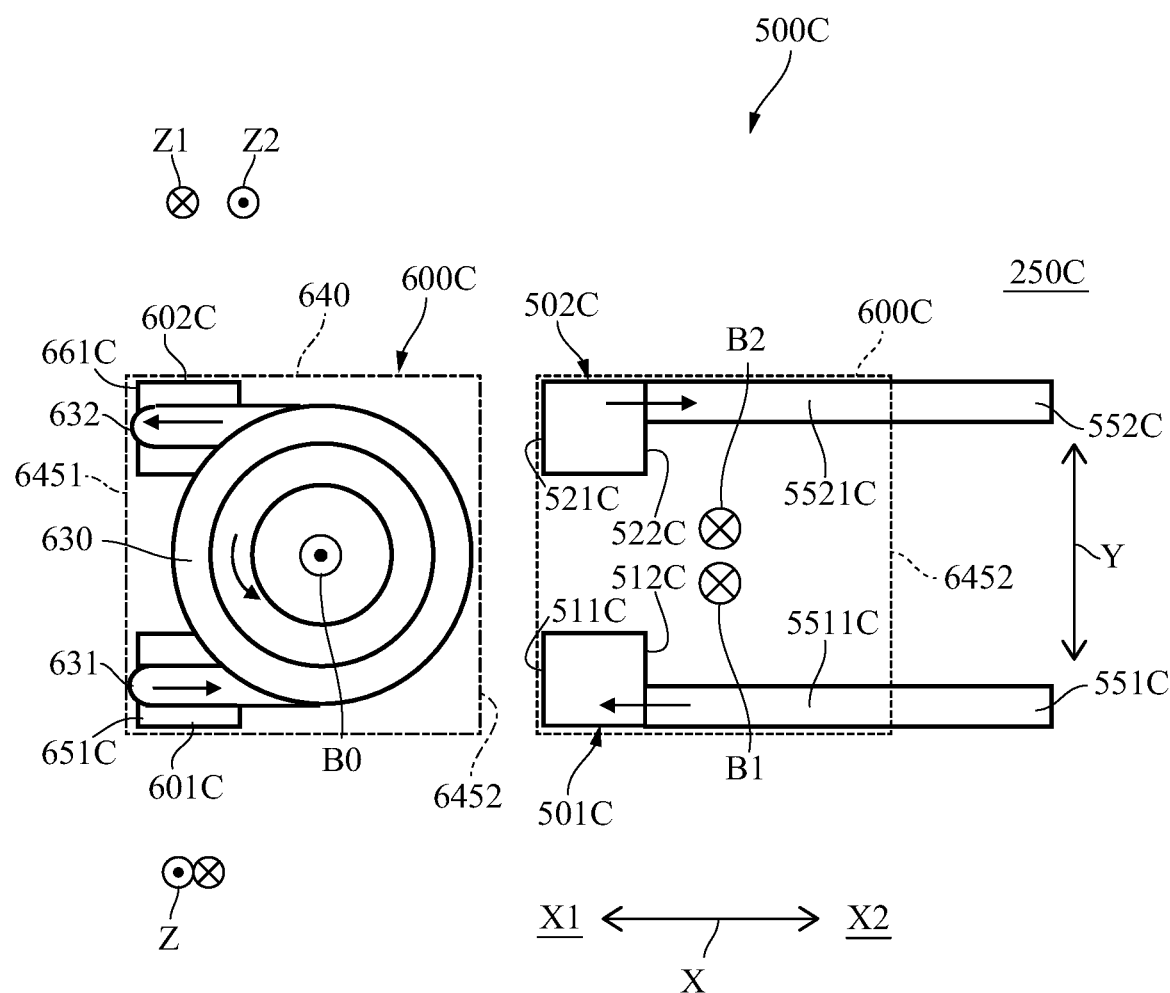
FIG. 11 is a plan view of part of a driving unit serving as an example of a printed circuit board according to a fourth embodiment.

An image capturing apparatus according to a fourth embodiment will be described. FIG. 11 is a plan view of part of a driving unit 500C serving as an example of a printed circuit board according to the fourth embodiment. The driving unit 500C includes an inductor 600C, and a printed wiring board 250C on which the inductor 600C is mounted. FIG. 11 illustrates part of the wiring structure of the inductor 600C and part of the wiring structure of the printed wiring board 250C. In the first embodiment described above, a case where the electrodes 601 and 602 and the pads 501 and 502 each have a rectangular shape as viewed in the Z direction as illustrated in FIGS. 6A and 6B has been described, but the shape may be not rectangular. To be noted, although the inductor 600C is mounted on the printed wiring board 250C, the inductor 600C is illustrated in a displaced manner with respect to the printed wiring board 250C in FIG. 11 for the sake of convenience of description. In the fourth embodiment, substantially the same elements as in the first embodiment will be denoted by the same reference signs and description thereof will be omitted.

Similarly to the first embodiment, the inductor 600C includes the winding wire portion 630, the pair of wire portions 631 and 632 drawn out to the first side X1 in the X direction from the winding wire portion 630, and the magnetic core 640. In FIG. 11, the magnetic core 640 of the inductor 600C is indicated by a one-dot chain line. In addition, the inductor 600C is indicated by a broken line on the printed wiring board 250C.

The inductor 600C includes a pair of electrodes 601C and 602C arranged with an interval therebetween in the Y direction. The electrodes 601C and 602C each have a square shape as viewed in the Z direction. The pair of electrodes 601C and 602C are disposed at positions closer to the side edge 6451 on the magnetic core 640 among the side edge 6451 positioned on the first side X1 in the X direction and the side edge 6452 positioned on the second side X2 in the X direction. The wire portion 631 is connected to the electrode 601C via a bonding member such as solder, and the wire portion 632 is connected to the electrode 602C via a bonding member such as solder. Specifically, the wire portion 631 is connected to an end portion 651C of the electrode 601C on the first side X1 in the X direction, and the wire portion 632 is connected to an end portion 661C of the electrode 602C on the first side X1 in the X direction.

The printed wiring board 250C includes a pair of pads 501C and 502C, and a pair of wiring patterns 551C and 552C extending from the pair of pads 501C and 502C. The pads 501C and 502C each have a square shape as viewed in the Z direction. The pads 501C and 502C are respectively formed in sizes equal to or slightly larger than those of the electrodes 601C and 602C as viewed in the Z direction. The electrodes 601C and 602C of the inductor 600C are respectively connected to the pads 501C and 502C of the printed wiring board 250C via a bonding member such as solder.

The pad 501C includes an end 511C on the first side X1 in the X direction, and an end 512C on the second side X2 in the X direction. The pad 502C includes an end 521C on the first side X1 in the X direction, and an end 522C on the second side X2 in the X direction. In the fourth embodiment, the wiring pattern 551C is connected to the end 512C of the pad 501C. In addition, the wiring pattern 552C is connected to the end 522C of the pad 502C.

The wiring pattern 551C extends from the end 512C of the pad 501C toward the second side X2 in the X direction, and includes a portion 5511C that overlaps with the inductor 600C, that is, the magnetic core 640 as viewed in the Z direction. The wiring pattern 552C extends from the end 522C of the pad 502C toward the second side X2 in the X direction, and includes a portion 5521C that overlaps with the inductor 600C, that is, the magnetic core 640 as viewed in the Z direction. Therefore, the wiring patterns 551C and 552C extend to the outside of the inductor 600C from the side edge 6452 of the magnetic core 640 as viewed in the Z direction.

When a driving current flows in an arrow direction from the wiring pattern 551C, a magnetic flux B0 directed in the arrow Z2 direction opposite to the arrow Z1 direction is generated inside the winding wire portion 630.

Meanwhile, as a result of the driving current flowing from the end 512C toward the end 511C in the pad 501C and through the portion 5511C, a magnetic flux B1 directed in the arrow Z1 direction is generated between the pair of pads 501C and 502C. In addition, as a result of the driving current flowing from the end 521C toward the end 522C in the pad 502C and through the portion 5521C, a magnetic flux B2 directed in the arrow Z1 direction is generated between the pair of pads 501C and 502C. That is, the magnetic fluxes B1 and B2 are generated in a direction opposite to the magnetic flux B0. To be noted, since the driving current is an alternating current, the directions of the magnetic fluxes B0, B1, and B2 are reversed in the case where the driving current flows in a direction opposite to the direction of the arrow illustrated in FIG. 11, but also in this case, the magnetic fluxes B1 and B2 are generated in a direction opposite to the magnetic flux B0. As a result of this, the magnetic flux B0 is cancelled by the magnetic fluxes B1 and B2, and thus the magnetic field noise radiated from the inductor 600C is reduced.

Fifth Embodiment

Figure 12:
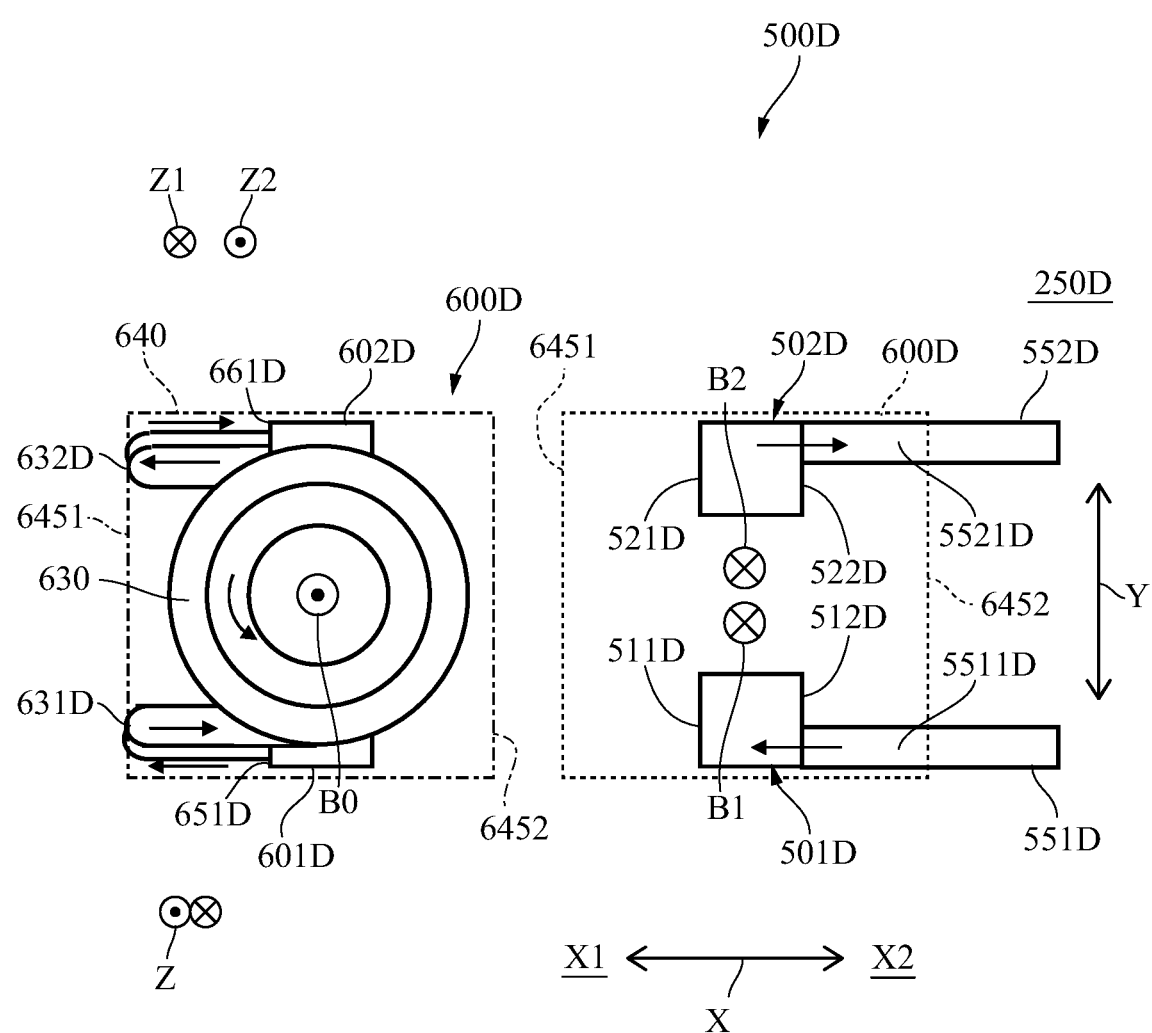
FIG. 12 is a plan view of part of a driving unit serving as an example of a printed circuit board according to a fifth embodiment.

An image capturing apparatus according to a fifth embodiment will be described. FIG. 12 is a plan view of part of a driving unit 500D serving as an example of a printed circuit board according to the fifth embodiment. The driving unit 500D includes an inductor 600D, and a printed wiring board 250D on which the inductor 600D is mounted. FIG. 12 illustrates part of the wiring structure of the inductor 600D and part of the wiring structure of the printed wiring board 250D. In the first embodiment described above, a case where the electrodes 601 and 602 and the pads 501 and 502 each have a rectangular shape as viewed in the Z direction as illustrated in FIGS. 6A and 6B has been described, but the shape may be not rectangular. To be noted, although the inductor 600D is mounted on the printed wiring board 250D, the inductor 600D is illustrated in a displaced manner with respect to the printed wiring board 250D in FIG. 12 for the sake of convenience of description. In the fifth embodiment, substantially the same elements as in the first embodiment will be denoted by the same reference signs and description thereof will be omitted.

Similarly to the first embodiment, the inductor 600D includes the winding wire portion 630, and the magnetic core 640. In FIG. 12, the magnetic core 640 of the inductor 600D is indicated by a one-dot chain line. In addition, the inductor 600D is indicated by a broken line on the printed wiring board 250D.

The inductor 600D includes a pair of wire portions 631D and 632D drawn out toward the first side X1 in the X direction from the winding wire portion 630, and a pair of electrodes 601D and 602D arranged with an interval therebetween in the Y direction. The electrodes 601D and 602D each have a square shape as viewed in the Z direction. The pair of electrodes 601D and 602D are disposed at the center between the side edge 6451 positioned on the first side X1 in the X direction and the side edge 6452 positioned on the second side X2 in the X direction on the magnetic core 640. The wire portion 631D is connected to the electrode 601D via a bonding member such as solder, and the wire portion 632D is connected to the electrode 602D via a bonding member such as solder. Specifically, the wire portion 631D is connected to an end portion 651D of the electrode 601D on the first side X1 in the X direction, and the wire portion 632D is connected to an end portion 661D of the electrode 602D on the first side X1 in the X direction.

In the fifth embodiment, the electrodes 601D and 602D are disposed at the center of the magnetic core 640 in the X direction. Therefore, the wire portions 631D and 632D drawn out toward the first side X1 in the X direction from the winding wire portion 630 are bent toward the second side X2 in the X direction at the side edge 6451 of the magnetic core 640 and respectively guided to the electrodes 601D and 602D.

The printed wiring board 250D includes a pair of pads 501D and 502D, and a pair of wiring patterns 551D and 552D extending from the pair of pads 501D and 502D. The pads 501D and 502D each have a square shape as viewed in the Z direction. The pads 501D and 502D are respectively formed in sizes equal to or slightly larger than those of the electrodes 601D and 602D as viewed in the Z direction. The electrodes 601D and 602D of the inductor 600D are respectively connected to the pads 501D and 502D of the printed wiring board 250D via a bonding member such as solder.

The pad 501D includes an end 511D on the first side X1 in the X direction, and an end 512D on the second side X2 in the X direction. The pad 502D includes an end 521D on the first side X1 in the X direction, and an end 522D on the second side X2 in the X direction. In the fifth embodiment, the wiring pattern 551D is connected to the end 512D of the pad 501D. In addition, the wiring pattern 552D is connected to the end 522D of the pad 502D.

The wiring pattern 551D extends from the end 512D of the pad 501D toward the second side X2 in the X direction, and includes a portion 5511D that overlaps with the inductor 600D, that is, the magnetic core 640 as viewed in the Z direction. The wiring pattern 552D extends from the end 522D of the pad 502D toward the second side X2 in the X direction, and includes a portion 5521D that overlaps with the inductor 600D, that is, the magnetic core 640 as viewed in the Z direction. Therefore, the wiring patterns 551D and 552D extend to the outside of the inductor 600D from the side edge 6452 of the magnetic core 640 as viewed in the Z direction.

When a driving current flows in an arrow direction from the wiring pattern 551D, a magnetic flux B0 directed in the arrow Z2 direction opposite to the arrow Z1 direction is generated inside the winding wire portion 630.

Meanwhile, as a result of the driving current flowing from the end 512D toward the end 511D in the pad 501D and through the portion 5511D, a magnetic flux B1 directed in the arrow Z1 direction is generated between the pair of pads 501D and 502D. In addition, as a result of the driving current flowing from the end 521D toward the end 522D in the pad 502D and through the portion 5521D, a magnetic flux B2 directed in the arrow Z1 direction is generated between the pair of pads 501D and 502D. That is, the magnetic fluxes B1 and B2 are generated in a direction opposite to the magnetic flux B0. To be noted, since the driving current is an alternating current, the directions of the magnetic fluxes B0, B1, and B2 are reversed in the case where the driving current flows in a direction opposite to the direction of the arrow illustrated in FIG. 12, but also in this case, the magnetic fluxes B1 and B2 are generated in a direction opposite to the magnetic flux B0. As a result of this, the magnetic flux B0 is cancelled by the magnetic fluxes B1 and B2, and thus the magnetic field noise radiated from the inductor 600D is reduced.

Sixth Embodiment

Figure 13:
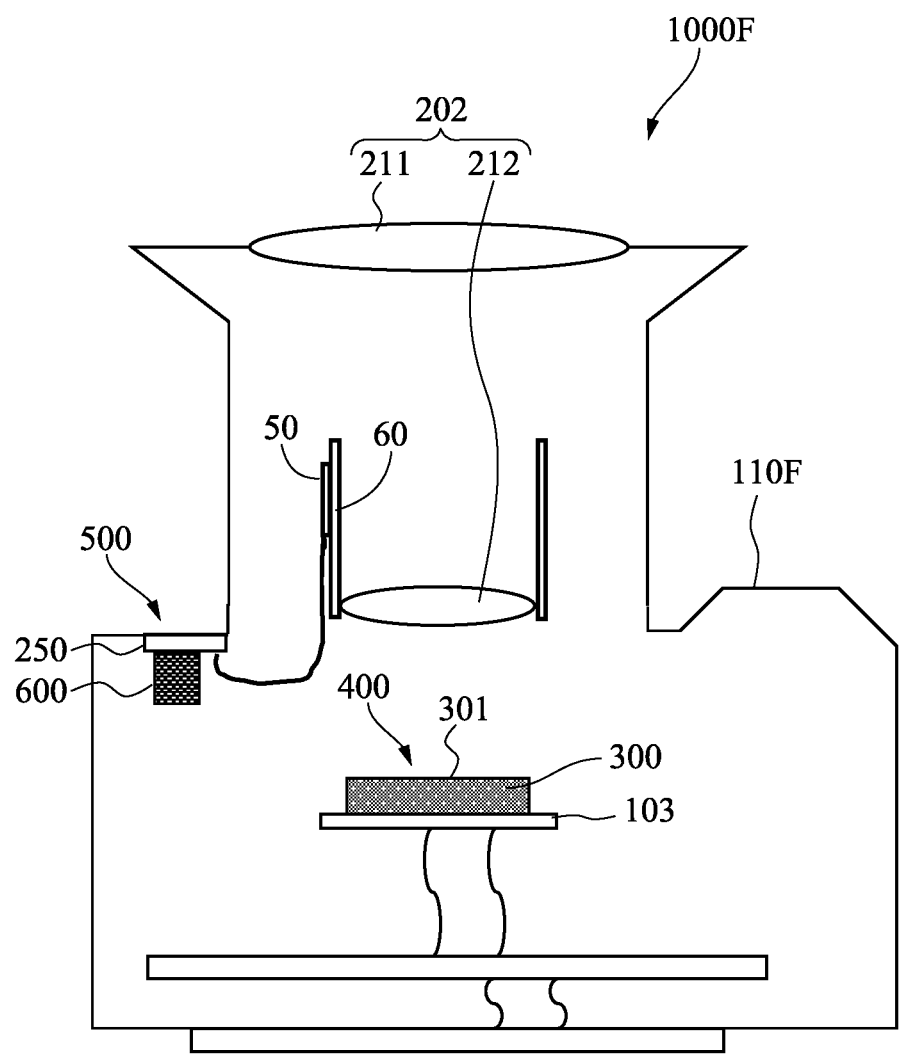
FIG. 13 is an explanatory diagram of a digital camera serving as an example of an image capturing apparatus according to a sixth embodiment.

An image capturing apparatus according to a sixth embodiment will be described. FIG. 13 is an explanatory diagram of a digital camera 1000F serving as an example of an image capturing apparatus according to the sixth embodiment. To be noted, in the sixth embodiment, substantially the same elements as in the first embodiment will be denoted by the same reference signs and description thereof will be omitted. FIG. 13 is a schematic top view of the digital camera 1000F.

The digital camera 1000F includes a casing 110F, and the image capturing unit 400 disposed inside the casing 110F. The image capturing unit 400 includes the image sensor 300 including the light receiving surface 301, and the printed wiring board 103 on which the image sensor 300 is mounted.

The digital camera 1000F includes the image capturing optical system 202 that is disposed inside the casing 110F and focuses an optical image on the light receiving surface 301 of the image sensor 300. The image capturing optical system 202 includes the plurality of lenses 211 and 212. The lens 212 is supported by the casing 110F via the slider 60 so as to be slidable in the optical axis direction.

The digital camera 1000F includes the USM 50 serving as an example of a vibration wave motor that is disposed inside the casing 110F and drives the lens 212 of the image capturing optical system 202 via the slider 60. The USM 50 also serves as an example of a load.

The digital camera 1000F includes the driving unit 500 serving as an example of a printed circuit board that is disposed inside the casing 110F and controls the driving operation of the image capturing optical system 202 performed by the USM 50. Similarly to the first embodiment, the driving unit 500 includes the printed wiring board 250, and the inductor 600 mounted on the printed wiring board 250. Although the driving unit 500 is disposed inside the lens casing 201 in the first embodiment, the driving unit 500 is disposed inside the casing 110F in the sixth embodiment. That is, whereas a case where the camera body and the lens barrel are separate members has been described in the first embodiment, in the sixth embodiment, the digital camera 1000F in which the camera body and the lens barrel are integrated is described is employed.

According to the sixth embodiment, the magnetic field noise radiated from the inductor 600 can be reduced with the wiring structure of the printed wiring board 250 even in the case of the digital camera 1000F in which the camera body and the lens barrel are integrated. Therefore, the magnetic field noise that reaches the image sensor 300 is reduced, and thus the quality of the captured image generated by the image sensor 300 is improved. For example, a clearer captured image can be obtained even in the case where an image of a scene of a small amount of light such as a night scenery is captured.

To be noted, although a case where the digital camera 1000F includes the driving unit 500 described in the first embodiment has been described in the sixth embodiment, the digital camera 1000F may include any of the driving units 500A to 500D described in the second to fifth embodiments.

The present invention should not be limited to the embodiments described above, and can be modified in many ways within the technical concept of the present invention. In addition, the effects described in the embodiments are mere enumeration of the most preferable effects that can be achieved by the present invention, and the effects of the present invention are not limited to those described in the embodiments.

Although a case where the inductor that generates the leaked magnetic flux that serves as a magnetic field noise on the image sensor is an inductor inserted between the driving circuit and FPC of the USM has been described, the inductor may be an inductor that is used for different application or for a different purpose. For example, the inductor may be an inductor disposed at a position near the image sensor in the exterior case, such as an inductor of an output filter portion of a switching power circuit or an inductor used in a driving circuit that supplies an alternating current such as a direct current brush motor for driving a shutter.

Although a case where each electrode has a quadrangular shape such as a rectangular shape or a square shape as viewed in the Z direction has been described in the above embodiments, each electrode may have a shape that is not quadrangular. For example, each electrode may have a polygonal shape such as a triangular shape different from a quadrangular shape, a circular shape, or an elliptical shape, as viewed in the Z direction.

Similarly, although a case where each pad has a quadrangular shape such as a rectangular shape or a square shape as viewed in the Z direction has been described in the above embodiments, each pad may have a shape that is not quadrangular. For example, each pad may have a polygonal shape such as a triangular shape different from a quadrangular shape, a circular shape, or an elliptical shape, as viewed in the Z direction.

In addition, although it is preferable that the pair of wiring patterns are each connected to an end on the second side X2 in the X direction of a corresponding pad as described in the first embodiment, the configuration is not limited to this. That is, at least one of the pair of wiring patterns may be not connected to an end on the second side X2 in the X direction of a corresponding pad. For example, a configuration in which one of the pair of wiring patterns is connected to the end on the second side X2 in the X direction of the corresponding pad as in the first embodiment and the other of the pair of wiring patterns is connected to a side end of the corresponding pad as in the second or third embodiment may be employed.

In addition, although a case where the image capturing apparatus is a digital camera has been described in the above embodiments, the configuration is not limited to this. For example, the present invention is also applicable to a case where the image capturing apparatus is a mobile terminal such as a mobile phone, a smartphone, a tablet terminal, or a laptop computer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-023822, filed Feb. 14, 2020, which is hereby incorporated by reference herein in its entirety.

What is claimed is:

1. An image capturing apparatus comprising:
a casing;
an image sensor provided inside the casing;
a printed wiring board provided inside the casing; and
an inductor mounted on the printed wiring board,
wherein the inductor comprises
a winding wire portion,
a pair of wire portions drawn out from the winding wire portion to a first side in a first direction, and
a pair of electrodes provided with an interval therebetween in a second direction intersecting to the first direction and connected to the pair of wire portions,
wherein the printed wiring board comprises
a pair of pads connected to the pair of electrodes, and
a pair of wiring patterns extending from the pair of pads, and
wherein each of the pair of wiring patterns extends from a first portion of corresponding one of the pair of pads, the first portion being a portion extending from an end of the corresponding one of the pair of pads on a second side in the first direction to a length that is two thirds of a length of the corresponding one of the pair of pads in the first direction.

2. The image capturing apparatus according to claim 1, wherein at least one of the pair of wiring patterns extends from a second portion of the corresponding one of the pair of pads, the second portion being a portion extending from the end of the corresponding one of the pair of pads on the second side in the first direction to a length that is one third of the length of the corresponding one of the pair of pads in the first direction.

3. The image capturing apparatus according to claim 1, wherein at least one of the pair of wiring patterns extends from the end of the corresponding one of the pair of pads on the second side in the first direction.

4. The image capturing apparatus according to claim 3, wherein the at least one of the pair of wiring patterns comprises a portion that overlaps with the inductor as viewed in a third direction intersecting to the first direction and the second direction.

5. The image capturing apparatus according to claim 1, wherein each of the pair of pads has a shape that is longer in the first direction than in the second direction.

6. The image capturing apparatus according to claim 1, wherein the inductor further comprises a magnetic core provided so as to surround the winding wire portion.

7. The image capturing apparatus according to claim 1, further comprising a driving circuit configured to supply an alternating current to the inductor.

8. The image capturing apparatus according to claim 1, further comprising:
an image capturing optical system comprising a plurality of lenses for focusing an image on the image sensor;
a vibration wave motor configured to drive at least one of the plurality of lenses; and a driving circuit configured to supply an alternating current to the vibration wave motor through the inductor.

9. A lens barrel comprising:
a lens casing;
an image capturing optical system provided inside the lens casing and configured to focus light on an image sensor;
a printed wiring board provided inside the lens casing; and
an inductor mounted on the printed wiring board,
wherein the inductor comprises
a winding wire portion,
a pair of wire portions drawn out from the winding wire portion to a first side in a first direction, and
a pair of electrodes provided with an interval therebetween in a second direction intersecting to the first direction and connected to the pair of wire portions,
wherein the printed wiring board comprises
a pair of pads connected to the pair of electrodes, and
a pair of wiring patterns extending from the pair of pads, and
wherein each of the pair of wiring patterns extends from a first portion of corresponding one of the pair of pads, the first portion being a portion extending from an end of the corresponding one of the pair of pads on a second side in the first direction to a length that is two thirds of a length of the corresponding one of the pair of pads in the first direction.

10. The lens barrel according to claim 9, wherein at least one of the pair of wiring patterns extends from a second portion of the corresponding one of the pair of pads, the second portion being a portion extending from the end of the corresponding one of the pair of pads on the second side in the first direction to a length that is one third of the length of the corresponding one of the pair of pads in the first direction.

11. The lens barrel according to claim 9, wherein at least one of the pair of wiring patterns extends from the end of the corresponding one of the pair of pads on the second side in the first direction.

12. The lens barrel according to claim 11, wherein the at least one of the pair of wiring patterns comprises a portion that overlaps with the inductor as viewed in a third direction intersecting to the first direction and the second direction.

13. The lens barrel according to claim 9, wherein each of the pair of pads has a shape that is longer in the first direction than in the second direction.

14. The lens barrel according to claim 9, wherein the inductor further comprises a magnetic core provided so as to surround the winding wire portion.

15. The lens barrel according to claim 9, further comprising:
a vibration wave motor configured to drive the image capturing optical system; and
a driving circuit configured to supply an alternating current to the vibration wave motor through the inductor.

16. A printed circuit board comprising:
a printed wiring board; and
an inductor mounted on the printed wiring board,
wherein the inductor comprises
a winding wire portion,
a pair of wire portions drawn out from the winding wire portion to a first side in a first direction, and
a pair of electrodes provided with an interval therebetween in a second direction intersecting to the first direction and connected to the pair of wire portions,
wherein the printed wiring board comprises
a pair of pads connected to the pair of electrodes, and
a pair of wiring patterns extending from the pair of pads, and
wherein each of the pair of wiring patterns extends from a first portion of corresponding one of the pair of pads, the first portion being a portion extending from an end of the corresponding one of the pair of pads on a second side in the first direction to a length that is two thirds of a length of the corresponding one of the pair of pads in the first direction.

* * * * *